US012702052B2

(12) United States Patent
Wang et al.

(10) Patent No.: US 12,702,052 B2
(45) Date of Patent: Aug. 4, 2026

(54) FRAME EDGE REINFORCEMENT STRUCTURE FOR PACKAGE STRUCTURES AND METHODS OF USING THE SAME

(71) Applicant: Taiwan Semiconductor Manufacturing Company Limited, Hsinchu (TW)

(72) Inventors: Chin-Hua Wang, New Taipei City (TW); Tsung-Yen Lee, Hemei Township (TW); Cong-Wei Yang, Hsinchu (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 469 days.

(21) Appl. No.: 18/449,325

(22) Filed: Aug. 14, 2023

(65) Prior Publication Data

US 2025/0062176 A1     Feb. 20, 2025

(51) Int. Cl.
    *H01L 23/48*        (2006.01)
    *H01L 23/52*        (2006.01)
    (Continued)

(52) U.S. Cl.
    CPC ......... *H10W 74/141* (2026.01); *H10W 74/01* (2026.01); *H10W 74/117* (2026.01);
    (Continued)

(58) Field of Classification Search
    CPC . H01L 23/3185; H01L 21/56; H01L 23/3128; H01L 23/3135; H01L 23/3192;
    (Continued)

(56) References Cited

U.S. PATENT DOCUMENTS

2021/0375826 A1*  12/2021  Chen ........................ H10P 54/00
2022/0199449 A1*   6/2022  Baker ................. H10P 72/0446
            (Continued)

FOREIGN PATENT DOCUMENTS

TW          201709439 A      3/2017
TW          202211395 A      3/2022
TW          202315028 A      4/2023

OTHER PUBLICATIONS

TW Patent and Trademark Office; TW Application No. 112137858 Office Action mailed Nov. 29, 2024; 22 pages.

*Primary Examiner* — Niki H Nguyen
(74) *Attorney, Agent, or Firm* — The Marbury Law Group, PLLC

(57)         ABSTRACT

A device structure includes: an interposer including interposer dielectric material layers having formed therein interposer metal interconnect structures and die-side interposer bonding pads; at least one semiconductor die having formed therein in-die bonding pads that are bonded to a respective one of the die-side interposer bonding pads by metal-to-metal bonding; and a composite die frame laterally surrounding the at least one semiconductor die. The composite die frame includes a molding compound die frame portion including a molding compound material and frame edge reinforcement structures located at corners of the composite die frame and including a material having a lower coefficient of thermal expansion at 20 degrees Celsius than the molding compound material.

20 Claims, 31 Drawing Sheets

(51) Int. Cl.

| | | |
|---|---|---|
| *H01L 29/40* | (2006.01) |
| *H10W 74/01* | (2026.01) |
| *H10W 74/10* | (2026.01) |
| *H10W 72/90* | (2026.01) |
| *H10W 80/00* | (2026.01) |
| *H10W 90/00* | (2026.01) |

(52) U.S. Cl.

CPC ....... *H10W 74/121* (2026.01); *H10W 74/147* (2026.01); *H10W 72/941* (2026.01); *H10W 72/952* (2026.01); *H10W 80/327* (2026.01); *H10W 80/333* (2026.01); *H10W 90/731* (2026.01); *H10W 90/794* (2026.01)

(58) Field of Classification Search

CPC ......... H01L 24/05; H01L 24/08; H01L 24/80; H01L 24/32; H01L 2224/05647; H01L 2224/08225; H01L 2224/32221; H01L 2224/80201; H01L 2224/80357; H01L 2224/80447; H01L 2224/80896; H01L 2924/181; H01L 2224/48247; H01L 2224/73204; H01L 2224/16225; H01L 2924/15311; H01L 2224/16235; H01L 2224/48465; H01L 23/49503; H01L 2221/68345; H01L 2224/05554; H01L 2224/48137; H01L 2224/73253; H01L 24/97; H01L 21/563; H01L 21/60; H01L 2224/48227; H01L 2224/4824; H01L 2224/48257; H01L 2224/4826; H01L 2224/49111; H01L 2224/73203; H01L 2224/97; H01L 23/28; H01L 23/49537; H01L 24/06; H01L 24/73; H01L 25/072; H01L 25/18; H01L 2224/49113; H01L 2224/85201; H01L 2224/85181; H01L 23/04; H01L 23/053; H01L 23/49513; H01L 23/4952

See application file for complete search history.

(56) References Cited

U.S. PATENT DOCUMENTS

| | | | |
|---|---|---|---|
| 2022/0399287 A1 | 12/2022 | Choi | |
| 2022/0406729 A1* | 12/2022 | Lai ..................... | H10W 42/121 |
| 2023/0136656 A1 | 5/2023 | Lai et al. | |
| 2023/0207487 A1 | 6/2023 | Kang et al. | |

* cited by examiner

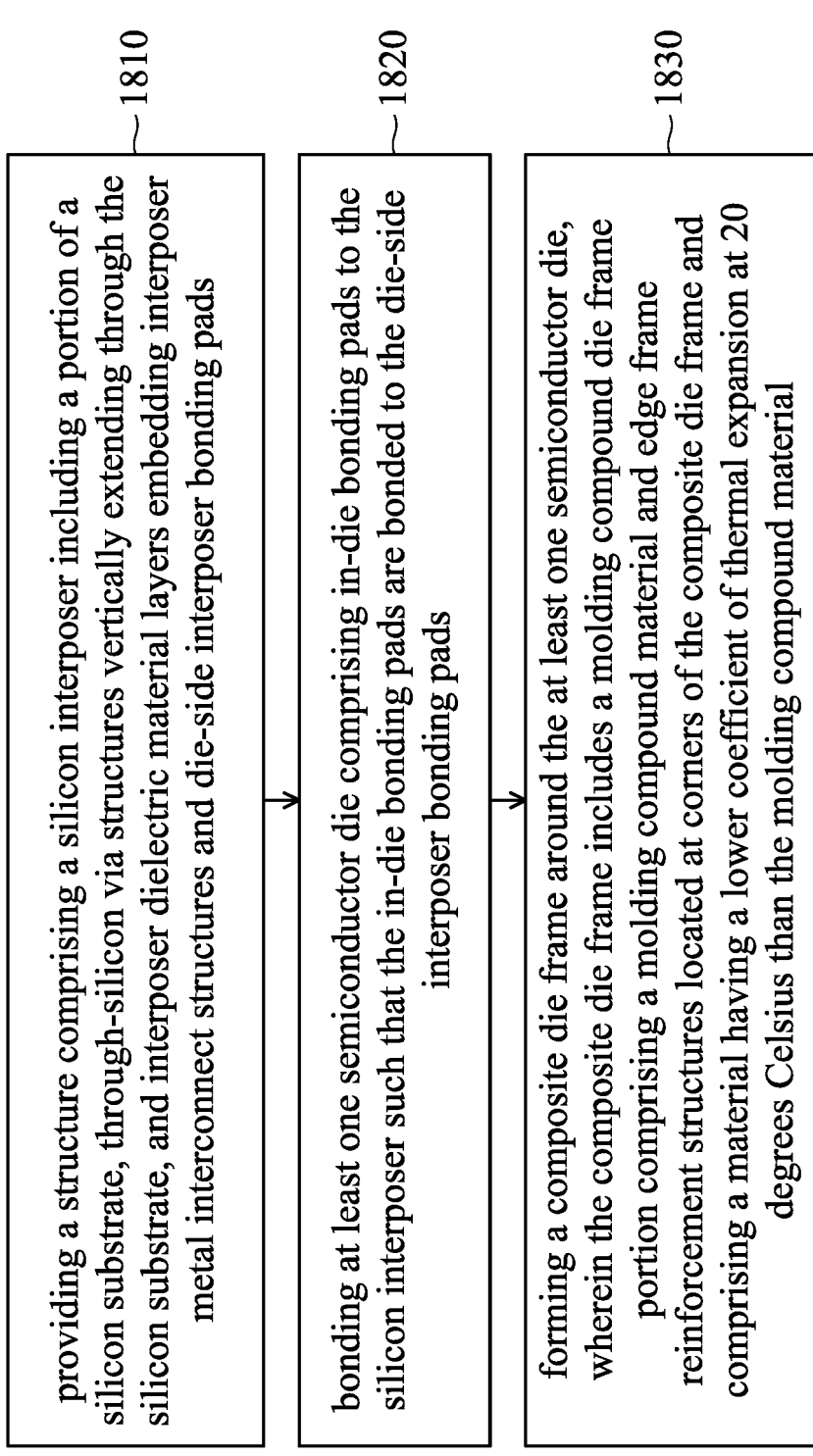

1810 providing a structure comprising a silicon interposer including a portion of a silicon substrate, through-silicon via structures vertically extending through the silicon substrate, and interposer dielectric material layers embedding interposer metal interconnect structures and die-side interposer bonding pads

1820 bonding at least one semiconductor die comprising in-die bonding pads to the silicon interposer such that the in-die bonding pads are bonded to the die-side interposer bonding pads

1830 forming a composite die frame around the at least one semiconductor die, wherein the composite die frame includes a molding compound die frame portion comprising a molding compound material and edge frame reinforcement structures located at corners of the composite die frame and comprising a material having a lower coefficient of thermal expansion at 20 degrees Celsius than the molding compound material

FIG. 18

FRAME EDGE REINFORCEMENT STRUCTURE FOR PACKAGE STRUCTURES AND METHODS OF USING THE SAME

BACKGROUND

Temperature variations on semiconductor packages may induce warpage in the package structure. Warpage may be a result of a differential coefficient of thermal expansion (CTE) between different bonded layers, e.g., silicon and organic substrate, in the package structure. Such warpage may also induce cracking within, or at interfaces between, various material components due to mismatch in coefficients of thermal expansion (CTE).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 18 is a flowchart illustrating steps for forming a device structure according to an embodiment of the present disclosure.

DETAILED DESCRIPTION

Figure 1A:
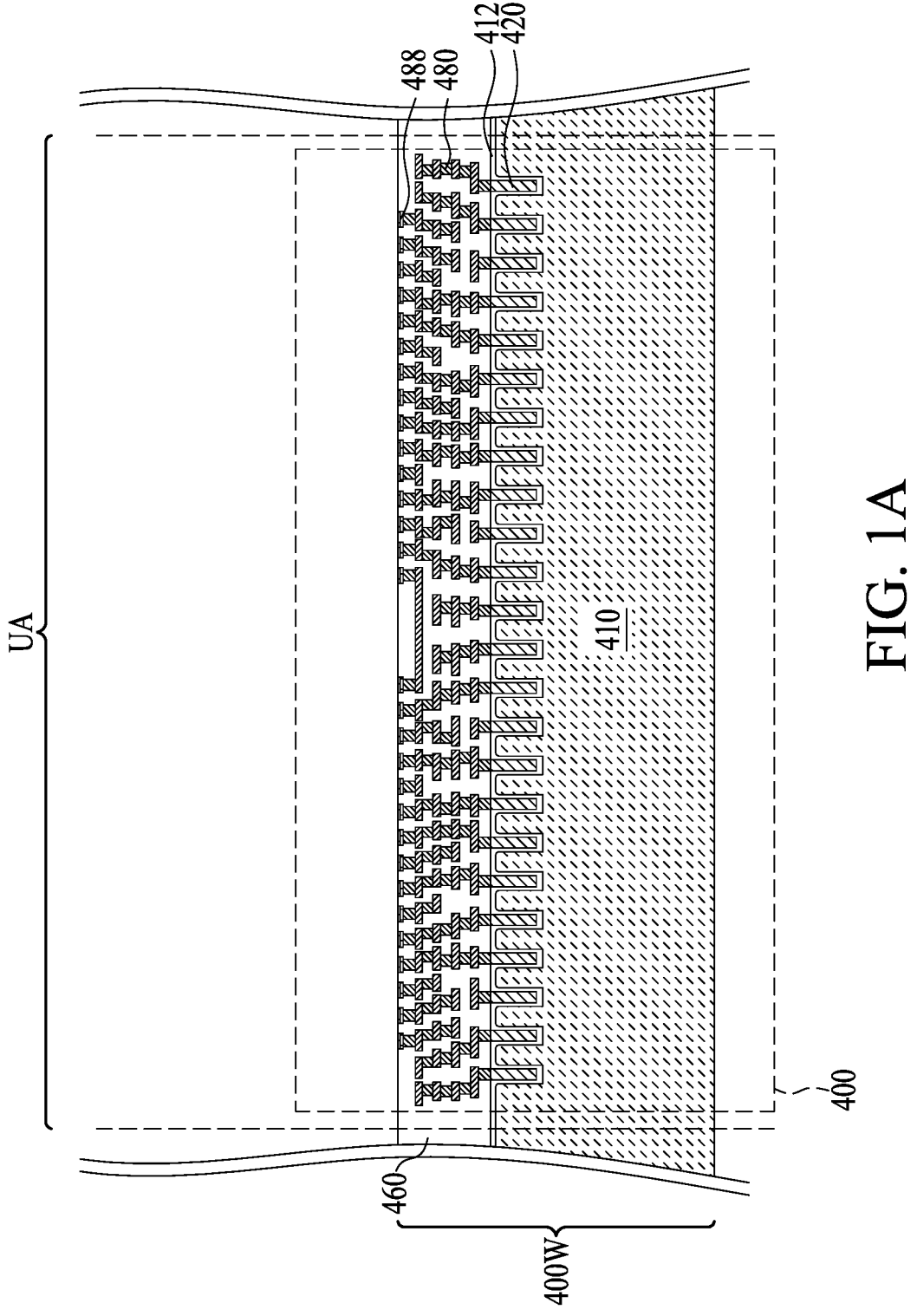
FIG. 1A is a vertical cross-sectional view of a silicon wafer after formation of through-substrate via structures and metal interconnect structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Differences in coefficients of thermal expansion (CTE) among components of a package structure may cause cracks within the package structure. For example, if the temperature of a fan-out package including semiconductor dies, a molding round the semiconductor dies, a silicon interposer, a packaging substrate, and a lid structure overlying the semiconductor dies, components with higher CTE's such as the molding, the lid, and the packaging substrate may expand more than the semiconductor dies and the silicon interposer. As a result, a tensile stress may be applied to the interface between the semiconductor dies and the silicon interposer. Cracks may develop at the interface under such conditions.

Embodiments of the present disclosure provide structures and methods for mitigating against the development of such cracks. Specifically, frame edge reinforcement structures may be used in combination with a molding compound frame component to provide a composite die frame. The molding compound frame component comprises a molding compound material, and may be provided at locations under lesser mechanical stress. The frame edge reinforcement structures may be located at frame edges that are subjected to a highest level of thermal-expansion-induced mechanical stress, and comprises a material having a lower coefficient of thermal expansion than the molding compound material. The composite die frame provides enhanced resistance to thermally induced cracks during usage of the package structure. Various aspects of the present disclosure are now described with reference to accompanying drawings.

Figure 1B:
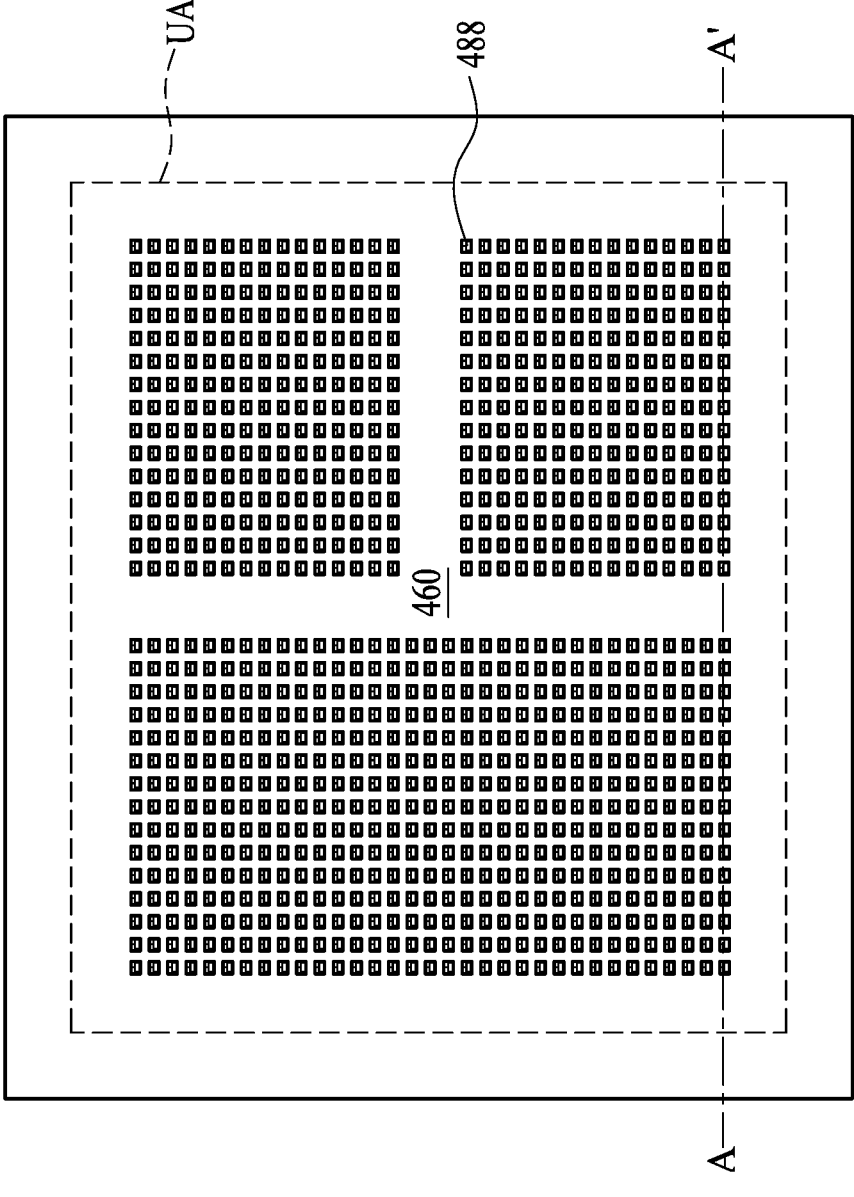
FIG. 1B is a top-down view of the silicon wafer of FIG. 1A.

Referring to FIGS. 1A and 1B, an intermediate structure according to an embodiment of the present disclosure is illustrated, which comprises a silicon wafer, through-substrate via structures 420 formed in an upper portion of the silicon wafer, and interposer dielectric material layers 460 having formed therein metal interconnect structures 480 and metallic bonding pads, which are herein referred to as die-side interposer bonding pads 488. The silicon wafer may include a silicon substrate 410 consisting of a silicon-based semiconductor material. The silicon-based semiconductor material may be single crystalline or polycrystalline, and may, or may not, be doped with electrical dopants such as p-type dopants or n-type dopants. In one embodiment, the silicon wafer may be a commercially available silicon wafer having a diameter of 150 mm, 200 mm, 300 mm, or 450 mm.

An array of via cavities may be formed in an upper portion of the silicon wafer, for example, by forming an etch mask layer including a hard mask material (such as borosilicate glass), by pattering the etch mask layer with patterns of arrays of discrete openings, and by transferring the pattern in the etch mask layer into an upper portion of the silicon wafer. The depth of the via cavities may be in a range from 3 microns to 30 microns, such as from 5 microns to 20 microns, and the lateral dimension (such as the diameter) of the via cavities may be in a range from 0.5 micron to 10 microns, such as from 1 micron to 6 microns, although lesser and greater lateral dimensions may also be used. In one embodiment, the pattern of the array of via cavities may have a two-dimensional periodicity over the silicon wafer. A unit pattern of repetition may be located within a unit area UA, which may be a rectangular area that corresponds to the area of an interposer to be diced out of the exemplary structure in a subsequent processing step.

A front insulating liner 412 may be formed in peripheral portions of the via cavities and over the top surface of the silicon substrate 410. The front insulating liner 412 includes an insulating material such as silicon oxide, and has a thickness in a range from 1% to 20%, such as from 2% to 5% of the lateral dimension of each via cavity. At least one conductive material, such as at least one metallic material, may be deposited in remaining unfilled volumes of the via cavities. In one embodiment, the at least one conductive material may comprise a combination of a metallic barrier material (such as TiN, TaN, WN, MoN, TiC, TaC, WC, etc.) and a metallic fill material (such as Cu, Co, Ru, Mo, W, etc.). Other suitable metallic barrier materials and metallic fill materials are within the contemplated scope of disclosure. Excess portions of the at least one conductive material may be removed from above the horizontal plane including the top surface of the horizontally-extending portion of the front insulating liner 412 by a planarization process, which may comprise a chemical mechanical polishing process (CMP) and/or a recess etch process. Each remaining portion of the at least one conductive material located within a respective via cavity may comprise a through-silicon via (TSV) structure 420. An array of TSV structures 420 may be formed within each unit area UA.

The interposer dielectric material layers 460, the metal interconnect structures 480, and the die-side interposer bonding pads 488 may be subsequently formed over the TSV structures 420 and the front insulating liner 412. The interposer dielectric material layers 460 comprise, and/or consist essentially of, interlayer dielectric (ILD) materials such as silicon oxide, silicon nitride, organosilicate glass, etc. Other suitable dielectric materials are within the contemplated scope of disclosure. In one embodiment, the interposer dielectric material layers 460 may comprise, and/or may consist essentially of, inorganic dielectric materials such as silicon oxide and silicon nitride. The metal interconnect structures 480 may comprise metal lines and metal via structures that are interconnected to and from one another to provide electrically conductive paths. The die-side interposer bonding pads 488 are electrically connected to the metal interconnect structures 480.

In one embodiment, a first subset of the die-side interposer bonding pads 488 may be electrically connected to and from one another to provide electrically conductive paths to and from semiconductor dies to be subsequently bonded to the die-side interposer bonding pads 488. In one embodiment, one or more die-side interposer bonding pads 488 within the first subset of the die-side interposer bonding pads 488 may be electrically isolated from the TSV structures 420. In one embodiment, a second subset of the die-side interposer bonding pads 488 are electrically connected to a respective one of the TSV structures 420, and are electrically isolated from other die-side interposer bonding pads 488. In one embodiment, a third subset of the die-side interposer bonding pads 488 are electrically connected to a respective one of the TSV structures 420, and are electrically connected to a respective additional die-side interposer bonding pads 488.

The die-side interposer bonding pads 488 may be formed within a topmost interposer dielectric material layer 460 selected from the interposer dielectric material layers 460. In one embodiment, top surfaces of the die-side interposer bonding pads 488 may be located within a same horizontal plane as a top surface of the topmost interposer dielectric material layer 460 selected from the interposer dielectric material layers 460.

The intermediate structure illustrated in FIGS. 1A and 1B comprise an interposer wafer 400W including a two-dimensional array of interposers 400 that are adjoined to one another. Each interposer 400 is located within a respective unit area UA, and may be a silicon interposer 400, i.e., an interposer including a silicon substrate 410.

Generally, a structure comprising a silicon interposer 400 including a portion of a silicon substrate 410, through-silicon via structures 420 located within the silicon substrate 410, and interposer dielectric material layers 460 having formed therein interposer metal interconnect structures 480 and die-side interposer bonding pads 488. In one embodiment, the structure comprise a two-dimensional array of silicon interposers 400.

Figure 2A:
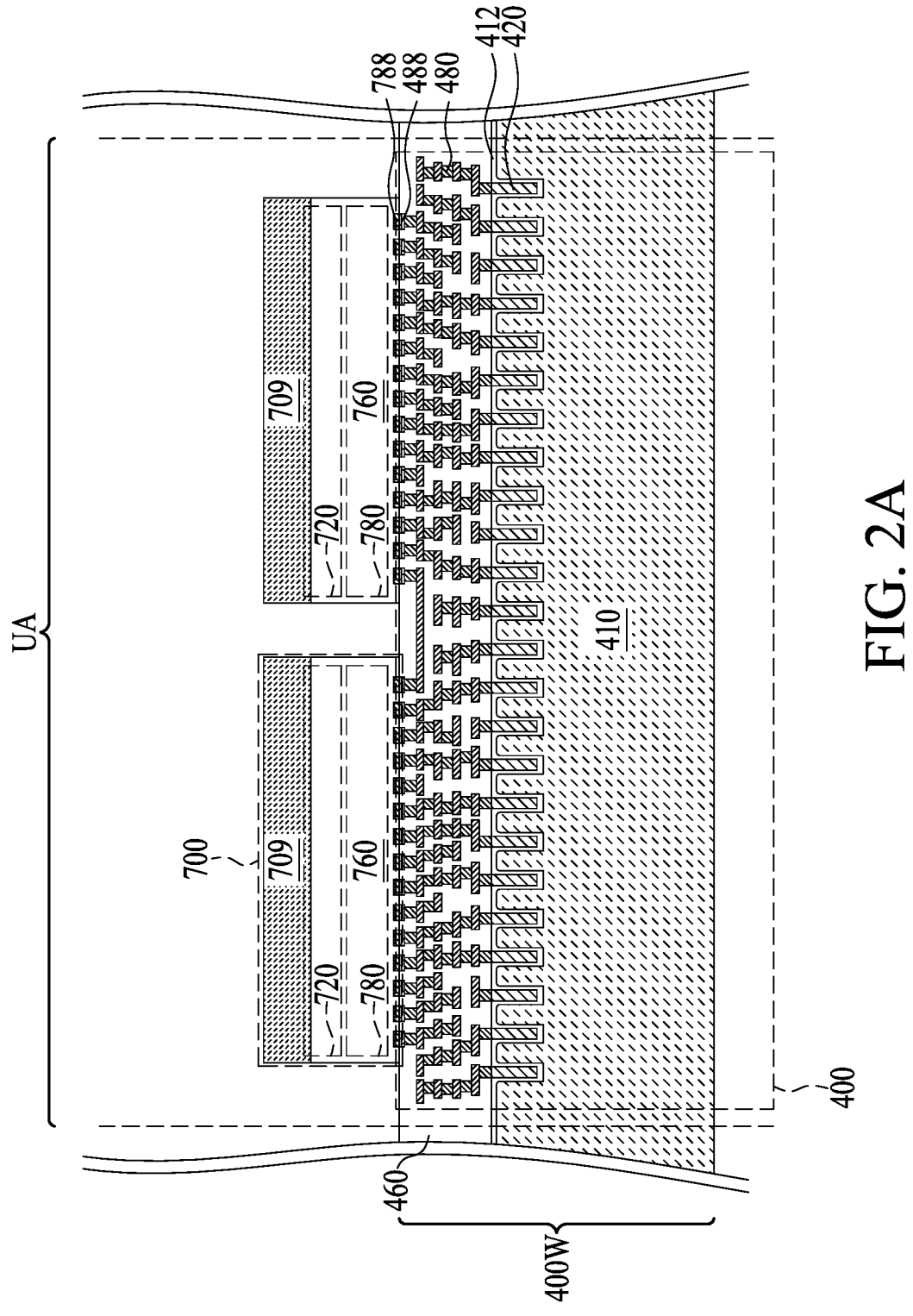
FIG. 2A is a vertical cross-sectional view of an assembly of the silicon wafer and semiconductor dies according to an embodiment of the present disclosure.
Figure 2B:
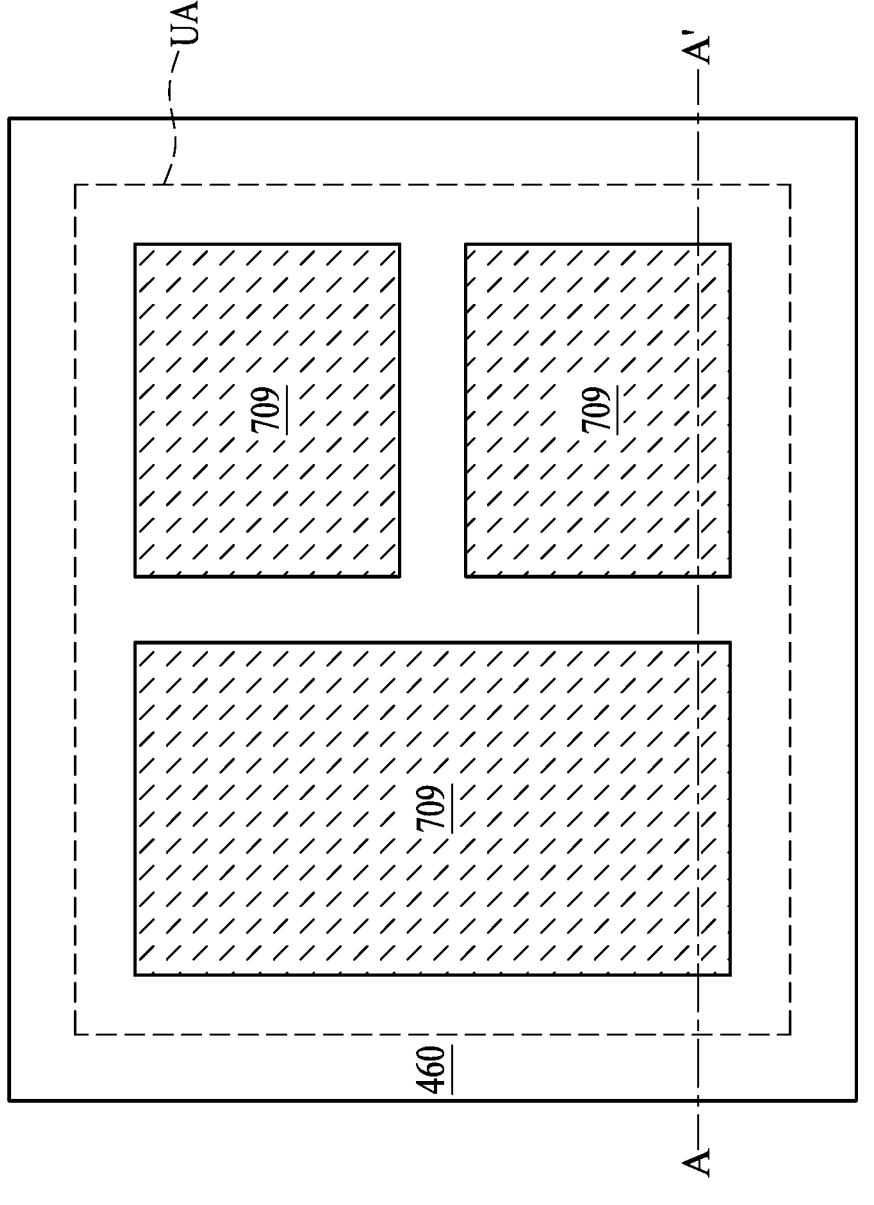
FIG. 2B is a top-down view of the assembly of FIG. 2A.

Referring to FIGS. 2A and 2B, a set of at least one semiconductor die 700 may be disposed over a respective silicon interposer 400 within a respective unit area. Each semiconductor die 700 may comprise a respective semiconductor die substrate 709, a respective set of semiconductor devices 720 located in, on, or over, the respective semiconductor die substrate 709, and respective in-die dielectric material layers 760 having formed therein in-die metal interconnect structures 780 and in-die bonding pads 788. In one embodiment, the respective semiconductor die substrate 709 may be a silicon substrate, and the respective set of semiconductor dies 700 may comprise various semiconductor devices known in the art such as field effect transistors. The in-die dielectric material layers 760 may comprise inorganic interlayer dielectric (ILD) materials such as silicon oxide or silicon nitride. The in-die metal interconnect structures 780 may comprise metal via structures and metal line structures that are interconnected to the semiconductor devices 720 and to one another. The in-die bonding pads 788 may be formed in a topmost dielectric material layer selected from the in-die dielectric material layers 760, and may be electrically connected to the in-die metal interconnect structures 780. In one embodiment, top surfaces of the in-die bonding pads 788 may be formed within a horizontal plane including a top surface of the topmost dielectric material layer selected from the in-die dielectric material layers 760.

Each set of at least one semiconductor die 700 includes at least one semiconductor die, and may comprise a plurality of semiconductor dies 700. For example, each set of at least one semiconductor die 700 may include at least one system-on-chip (SoC) die and/or at least one memory die. Each SoC die may comprise an application processor die, a central processing unit die, or a graphic processing unit die. In one embodiment, the at least one memory die may comprise a high bandwidth memory (HBM) die that includes a vertical stack of static random access memory dies. In one embodiment, the at least one semiconductor die may include at least one system-on-chip (SoC) die and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Figure 3A:
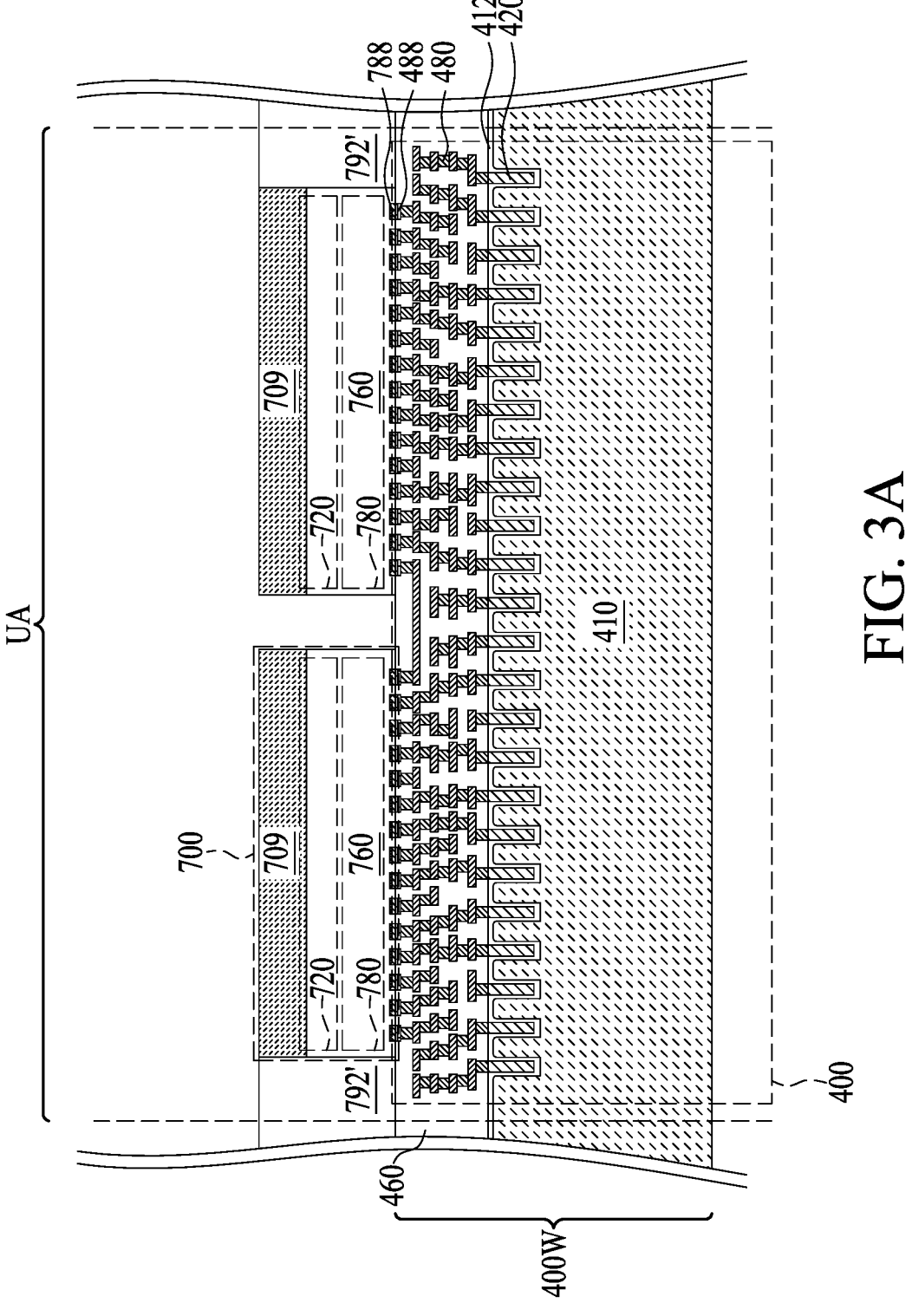
FIG. 3A is a vertical cross-sectional view an intermediate structure including the assembly of the silicon wafer and the semiconductor dies after positioning in-process frame edge reinforcement structures on the assembly according to an embodiment of the present disclosure.
Figure 3B:
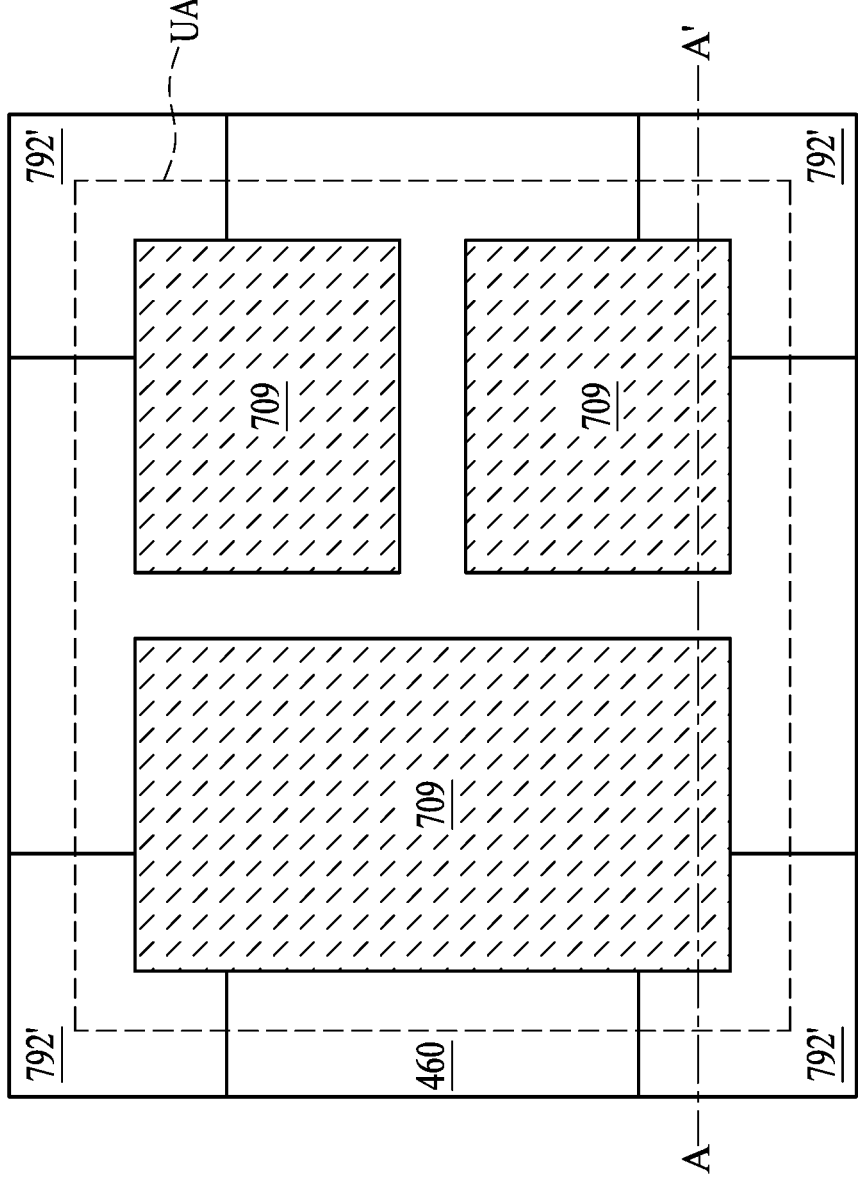
FIG. 3B is a top-down view of the intermediate structure of FIG. 3A.

Referring to FIGS. 3A and 3B and according to an aspect of the present disclosure, discrete material portions may be positioned at each corner of the rectangular areas of the unit areas UA at the level of the semiconductor dies 700. The discrete material portions are subsequently incorporated into die frames and provide the function of enhancing the structural stability of the die frames during thermal expansion. Prior to incorporation into a respective die frame, the discrete material portions can be diced into a respective set of diced material portions. As such, the discrete material portions are herein referred to as in-process frame edge reinforcement structures 792'. As used herein, an "in-process" structural element refers to a structural element that is subsequently modified in structure or in material composition.

Generally, the in-process frame edge reinforcement structures 792' comprise, and/or consist essentially of, a material that has a lower coefficient of thermal expansion than a molding compound material to be subsequently used to form a molding compound die frame layer. Typical molding compound materials used in the semiconductor industry have a coefficient of thermal expansion at 20 degrees Celsius in a range from 20 parts per million per degree Celsius to 40 parts per million per degree Celsius. Materials that may be used for the in-process frame edge reinforcement structures 792' include an additional molding compound material having a lower coefficient of thermal expansion (at 20 degrees Celsius) than the molding compound material to be subsequently used for the molding compound die frame layer, a die attachment film, an epoxy material, an underfill material, and a semiconductor material (such as silicon). The range of the coefficient of thermal expansion (at 20 degrees Celsius) for the material of the in-process frame edge reinforcement structures 792' may be in a range from 2 parts per million per degree to 25 parts per million per degree, and preferably from 2 parts per million per degree to 20 parts per million per degree, and more preferably from 2 parts per million per degree to 15 parts per million per degree. It should be recognized, however, that various embodiments disclosed herein may be practiced for any combination of a first material for the in-process frame edge reinforcement structures 792' and a second material for the molding compound die frame layer provided that the first material has a lower coefficient of thermal expansion at 20 degrees Celsius than the second material.

Generally, the in-process frame edge reinforcement structure 792' may have any shape provided that the in-process frame edge reinforcement structure 792' fit into gaps located at rectangular corners of the unit areas between neighboring pairs of sets of at least one semiconductor die 700, each set being bonded to a respective silicon interposer 400. In one embodiment, the in-process frame edge reinforcement structures 792' may have shapes that induce direct contact with each of the in-process frame edge reinforcement structure 792' with a respective set of semiconductor dies 700. In one embodiment, in instances in which an in-process frame edge reinforcement structure has a shape of a cross in a top-down view, the in-process frame edge reinforcement structure 792' may contact sidewalls of adjacent semiconductor dies 700. For example, a cross-shaped in-process frame edge reinforcement structure 792' may contact eight sidewalls of a four semiconductor dies 700.

In one embodiment, the in-process frame edge reinforcement structures 792' may be disposed directly on a top surface of the interposer dielectric material layers 460 around the semiconductor dies 700. In one embodiment, the at least one semiconductor die 700 within each unit area UA comprises a plurality of semiconductor dies 700. In one embodiment, the in-process frame edge reinforcement structures 792' can be positioned entirely outside areas of gaps between neighboring pairs of the plurality of semiconductor dies 700 in a plan view. In one embodiment, the in-process frame edge reinforcement structures 792' have a height that is not less than the maximum height of the semiconductor dies 700.

In one embodiment, one, a plurality, and/or each, of the in-process frame edge reinforcement structures 792' comprises vertically-extending sidewalls that are physically exposed to a gas-phase ambient. In one embodiment, one, a plurality, and/or each, of the in-process frame edge reinforcement structures 792' comprises at least one inner sidewall surface that is in direct contact with a respective semiconductor die 700. In one embodiment, one, a plurality, and/or each, of the in-process frame edge reinforcement structures 792' a proximal horizontal surface in direct contact with a horizontal surface of the interposer dielectric material layers 460.

The in-die bonding pads 788 of the semiconductor dies 700 may be aligned to the die-side interposer bonding pads 488 of a respective interposer 400 within the interposer wafer 400W. The in-process frame edge reinforcement structures 792' may be aligned to the gaps between sets of at least one semiconductor die 700 overlying neighboring pairs of interposers 400.

In one embodiment, each array of in-die bonding pads 788 in a semiconductor die 700 may be bonded to a respective subset of the array of die-side interposer bonding pads 488 by metal-to-metal bonding, such as copper-to-copper bonding. Further, the topmost dielectric material layer within the in-die dielectric material layers 760 of each semiconductor die 700 may be bonded to a topmost dielectric layer within the interposer dielectric material layers 460 by dielectric-to-dielectric bonding, such as oxide-to-oxide bonding. Generally, semiconductor dies 700 may be disposed over the two-dimensional array of interposers 400 such that each array of array of in-die bonding pads 788 contacts a respective subset of the array of die-side interposer bonding pads 488. The metal-to-metal bonding and the dielectric-to-dielectric bonding may be performed sequentially or simultaneously by performing a thermal anneal process in a temperature range from 200 degrees Celsius and 400 degrees Celsius while the semiconductor dies 700 are pressed against the interposer wafer 400W. The at least one semiconductor die 700 within each unit area UA may comprise a plurality of semiconductor dies 700 that are laterally spaced apart from one another, or may comprise a single semiconductor die 700.

Figure 3C:
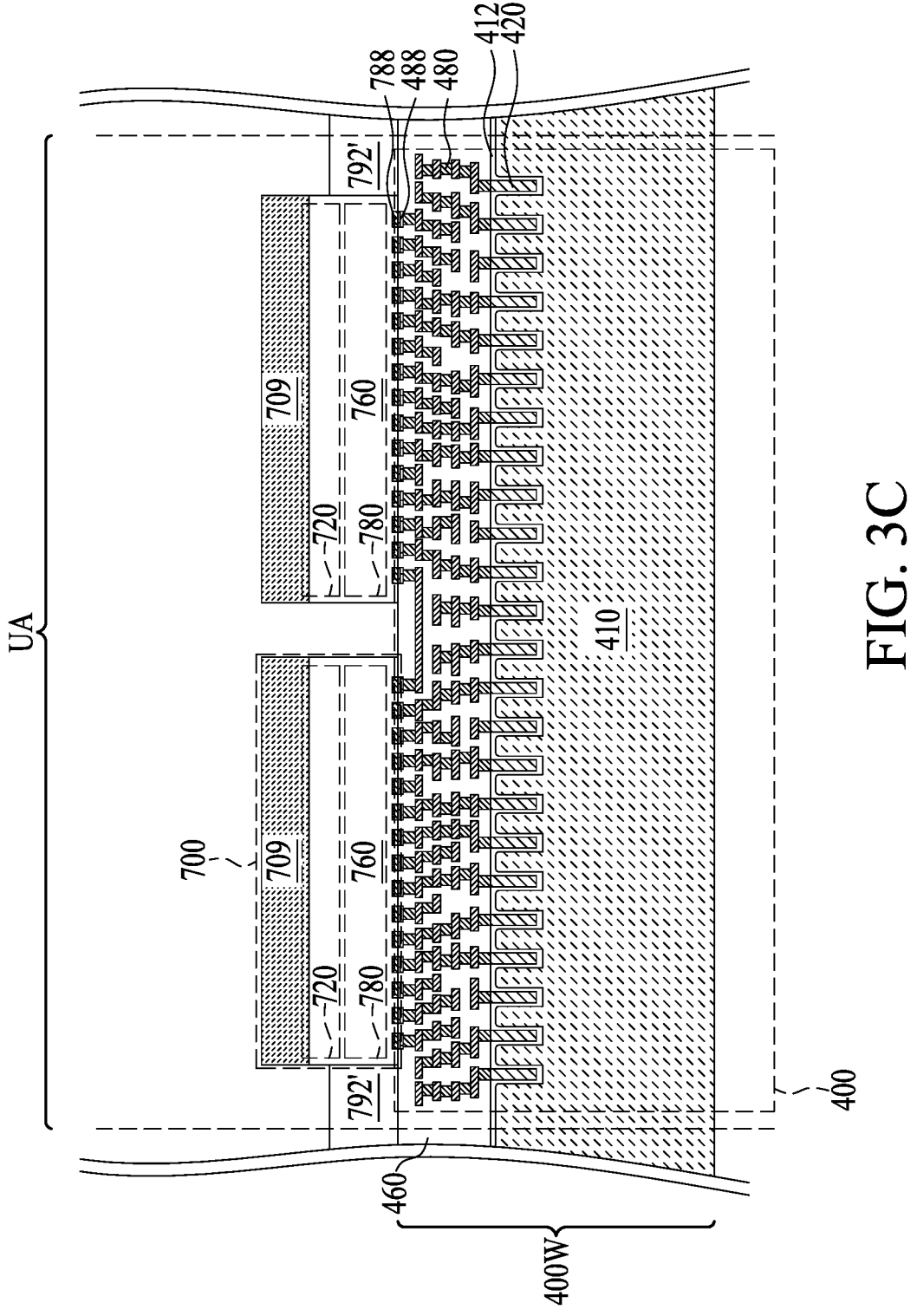
FIG. 3C is a vertical cross-sectional view of an alternative embodiment of the exemplary structure of FIGS. 3A and 3B according to an embodiment of the present disclosure.

Referring to FIG. 3C, is a vertical cross-sectional view of an alternative embodiment of the exemplary structure of FIGS. 3A and 3B is illustrated. The alternative configuration may be derived from the exemplary structure illustrated in FIGS. 3A and 3B by using in-process frame edge reinforcement structures 792' having heights that are less than the height of the semiconductor dies 700.

Figure 4A:
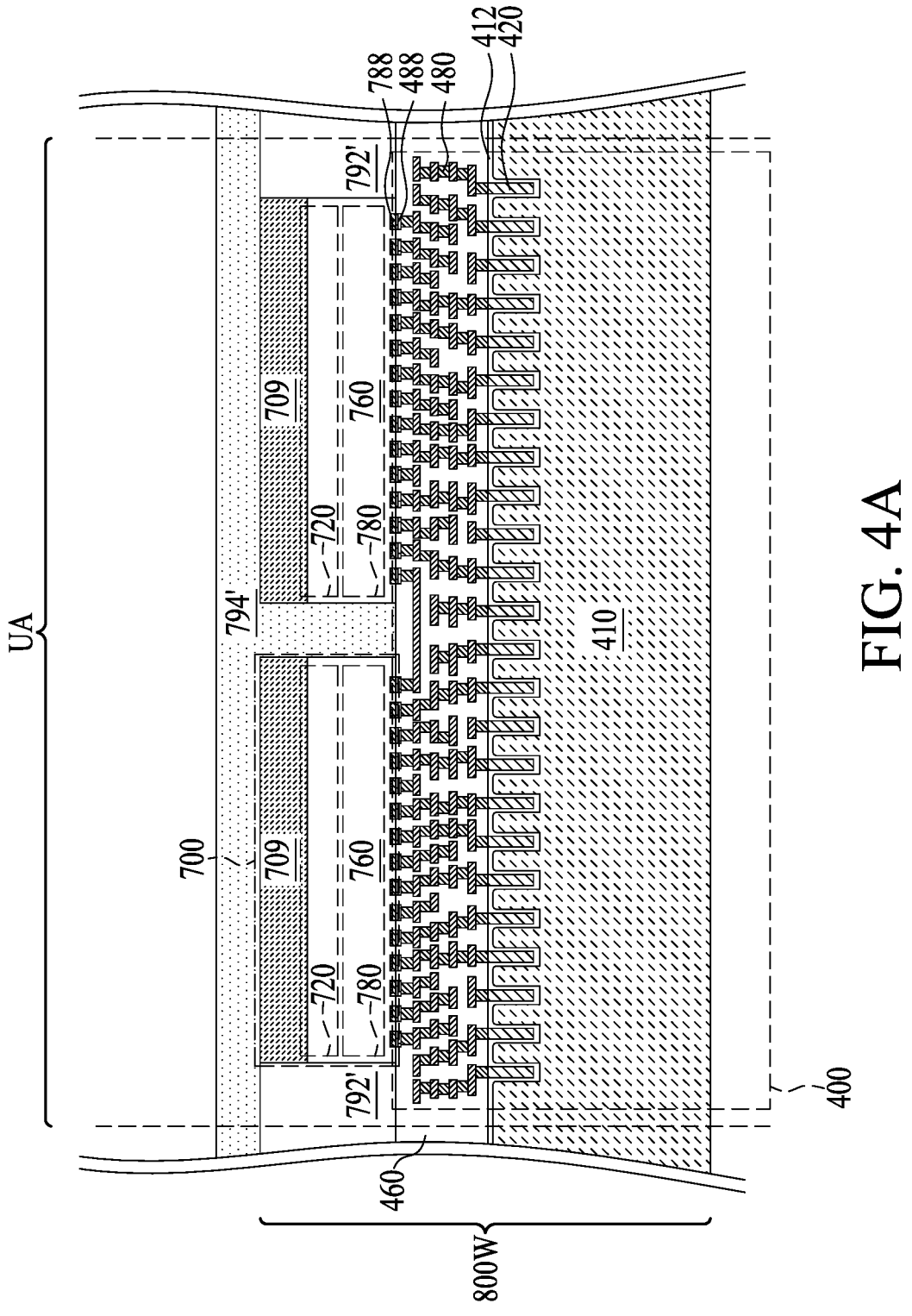
FIG. 4A is a vertical cross-sectional view of the intermediate structure after formation of a molding compound material layer according to an embodiment of the present disclosure.

Referring to FIG. 4A, a molding compound material may be applied over the interposer wafer 400W, the array of sets of at least one semiconductor die 700 that is bonded to the array of silicon interposers 400 in the interposer wafer 400W, and the in-process frame edge reinforcement structures 792'. The molding compound material includes an epoxy-containing compound that may be hardened (i.e., cured) to provide a dielectric material portion having sufficient stiffness and mechanical strength. The molding compound material may include epoxy resin, hardener, silica (as a filler material), and other additives. The molding compound material may be provided in a liquid form or in a solid form depending on the viscosity and flowability. Liquid molding compound material typically provides better handling, good flowability, less voids, better fill, and less flow marks. Solid molding compound material typically provides less cure shrinkage, better stand-off, and less die drift. A high filler content (such as 85% in weight) within a molding compound material may shorten the time in mold, lower the mold shrinkage, and reduce the mold warpage. Uniform filler size distribution in the molding compound material may reduce flow marks, and may enhance flowability.

A molding compound material layer 794' may be formed by the molding compound material. The molding compound material layer 794' may fill remaining gaps between neighboring pairs of semiconductor dies 700. The molding compound material layer 794' may cover each of the semiconductor dies 700, and may have a top surface that continuously extends over each of the semiconductor dies 700. Generally speaking, the molding compound material has a coefficient of thermal expansion at 20 degrees Celsius that is greater than the coefficient of thermal expansion of the material of the in-process frame edge reinforcement structures 792'. In one embodiment, the material of the in-process frame edge reinforcement structures 792' has a coefficient of thermal expansion that is less than the coefficient of thermal expansion of the molding compound material at any temperature within a temperature range between 20 degrees Celsius and 100 degrees Celsius. In one embodiment, the coefficient of thermal expansion of the in-process frame edge reinforcement structures 792' may be less than 90%, and/or less than 80%, and/or less than 70%, and/or less than 60%, and/or less than 50%, and/or less than 40%, and/or less than 30%, of the coefficient of thermal expansion of the molding compound material at any temperature within the temperature range from 20 degrees Celsius to 100 degrees Celsius. The combination of the interposer wafer 400W, the semiconductor dies 700, the in-process frame edge reinforcement structures 792', and the molding compound material layer 794' constitutes a reconstituted wafer 800W, which includes a plurality of fan-out packages under manufacture, i.e., a plurality of in-process fan-out packages.

Figure 4B:
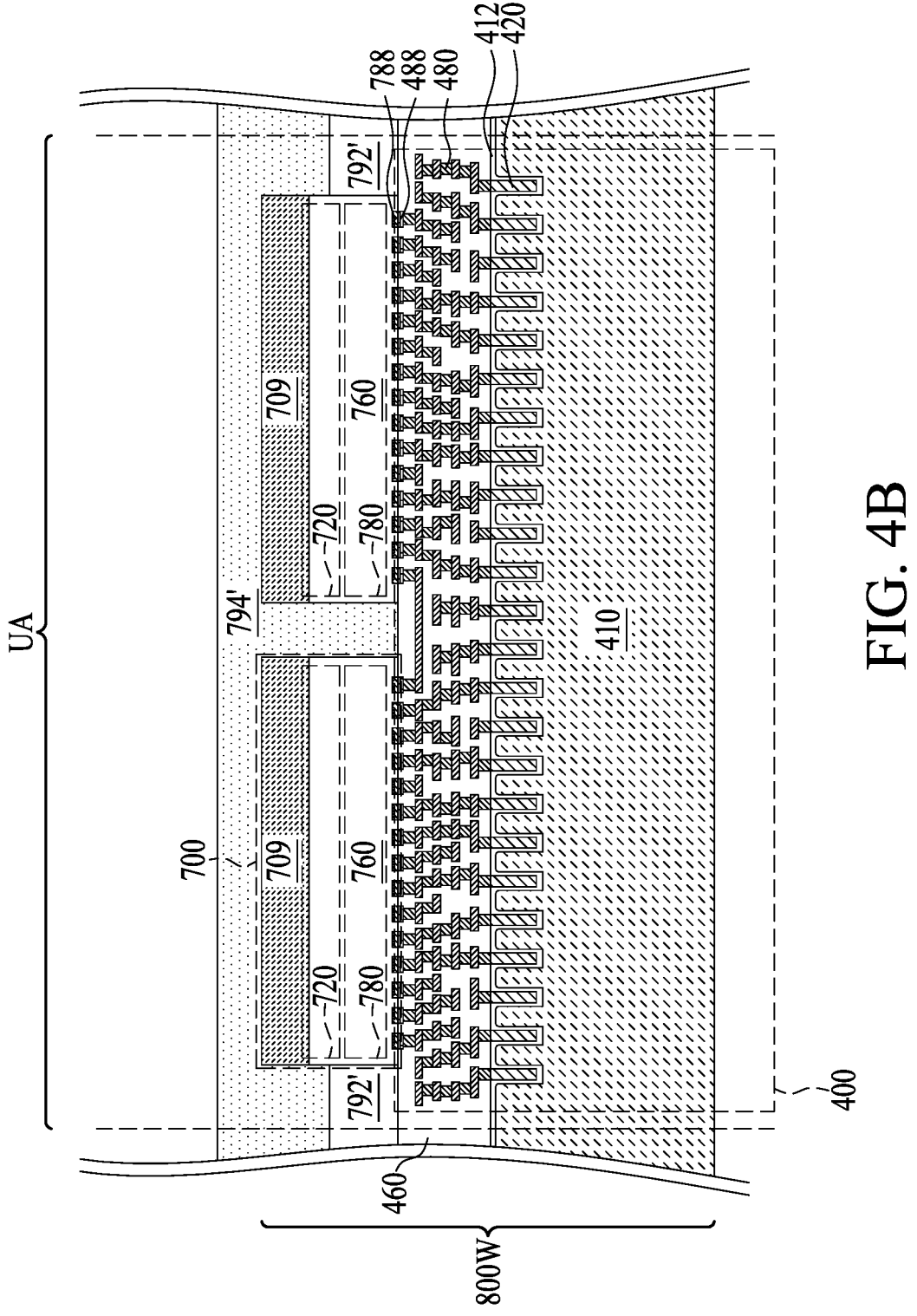
FIG. 4B is a vertical cross-sectional view of the alternative embodiment of the exemplary structure of FIG. 4A according to an embodiment of the present disclosure.

Referring to FIG. 4B, an alternative embodiment of the exemplary structure is shown after the processing steps described with reference to FIG. 4A. The alternative embodiment of the exemplary illustrated in FIG. 4B may be derived from the alternative embodiment of the exemplary structure illustrated in FIG. 3C by applying a molding compound material and by forming a molding compound material layer 794', which may have the same material property as the molding compound material layer 794' described with reference to FIG. 4A. In the alternative embodiment of the exemplary structure illustrated in FIG. 4B, the top surfaces of the in-process frame edge reinforcement structures 792' may be formed below the horizontal plane including the top surfaces of the thickest semiconductor dies 700 selected from the semiconductor dies 700 in the reconstituted wafer 800W.

Figure 5A:
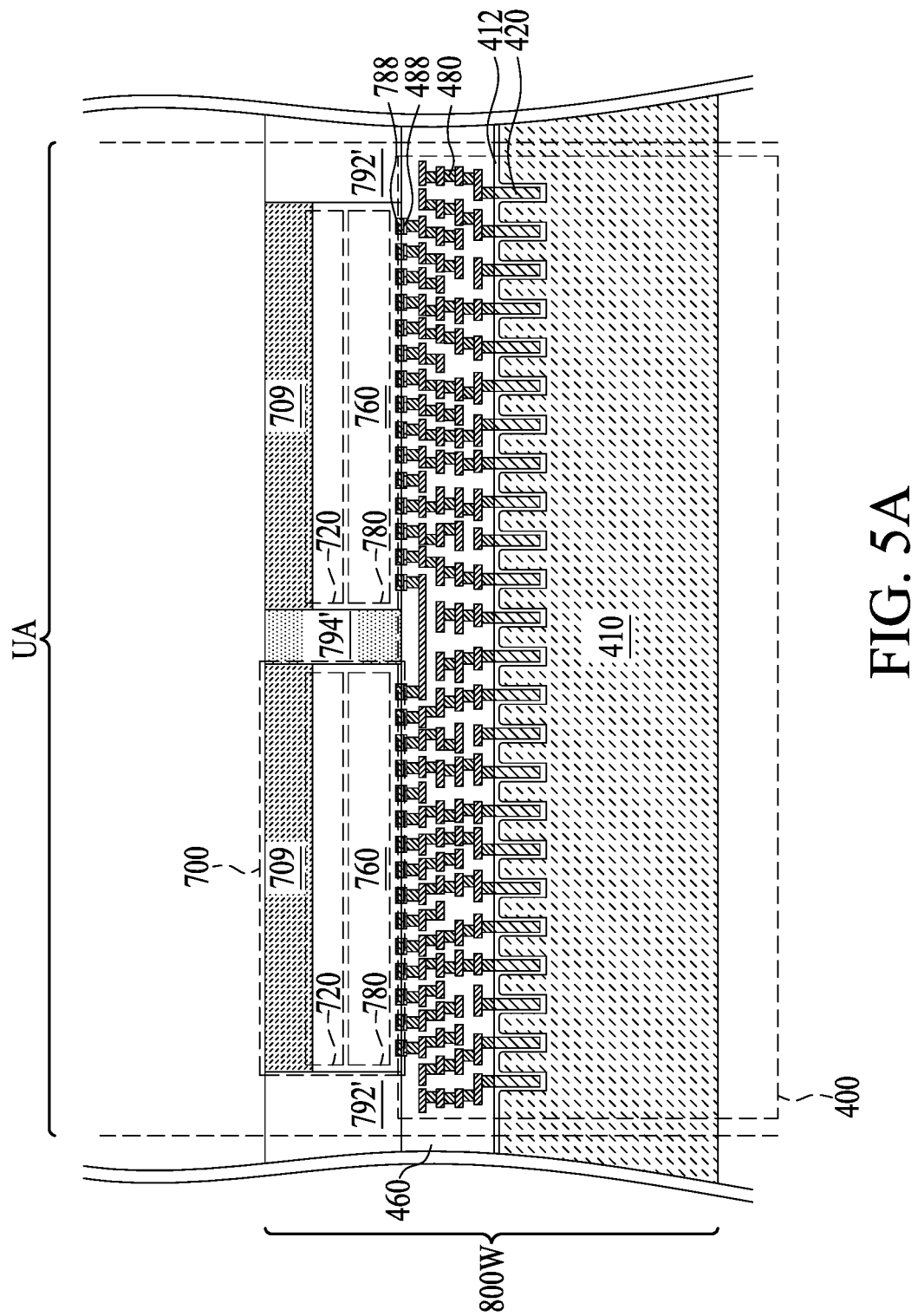
FIG. 5A is a vertical cross-sectional view of the intermediate structure after polishing the top side of the exemplary structure according to an embodiment of the present disclosure.
Figure 5B:
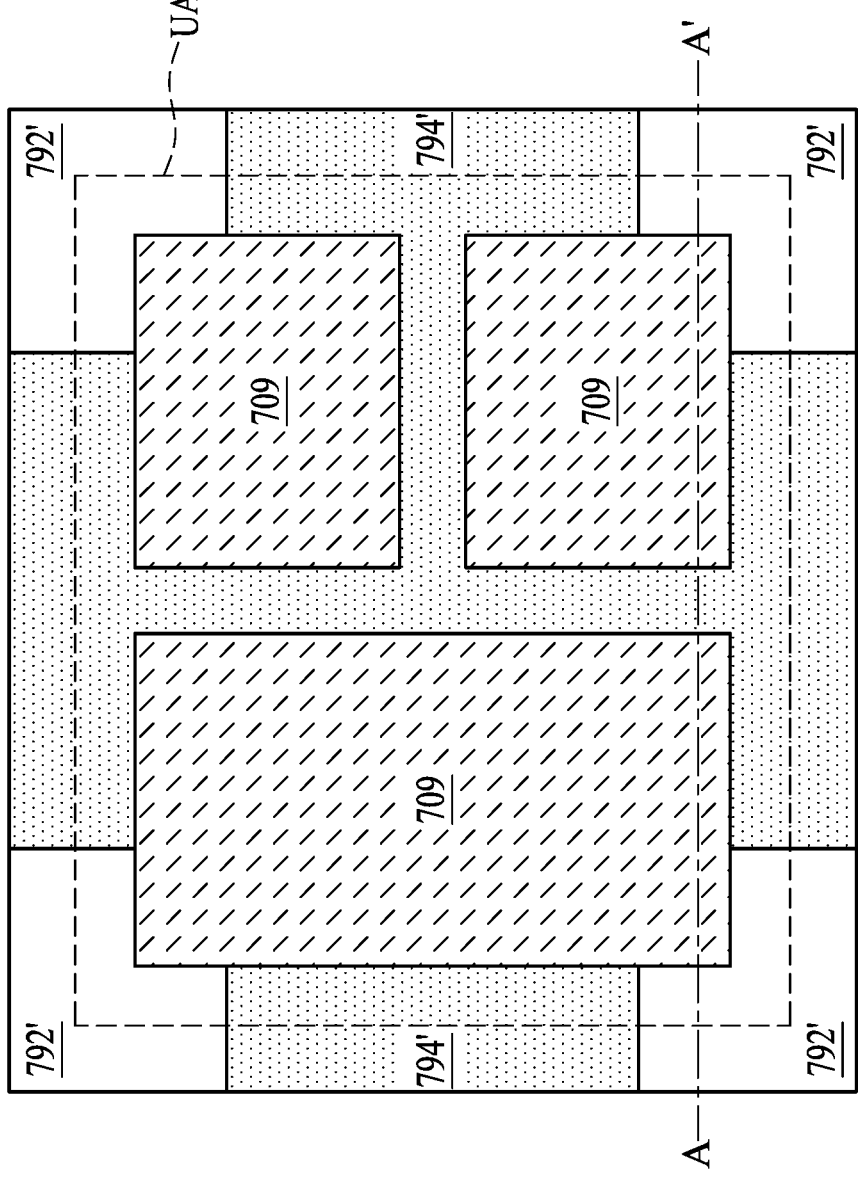
FIG. 5B is a top-down view of the intermediate structure of FIG. 5A.

Referring to FIGS. 5A and 5B, a polishing process may be performed to remove a horizontally-extending portion of the molding compound material layer 794' from above the horizontal plane including the top surfaces of the thinnest semiconductor dies 700. For example, a chemical mechanical polishing (CMP) process may be performed to remove the horizontally-extending portion of the molding compound material layer 794' and optionally to remove topmost portions of the semiconductor dies 700. All physically exposed top surfaces of the semiconductor dies 700 and a polished horizontal surface of the molding compound material layer 794' may be formed within a two-dimensional horizontal plane.

Figure 5C:
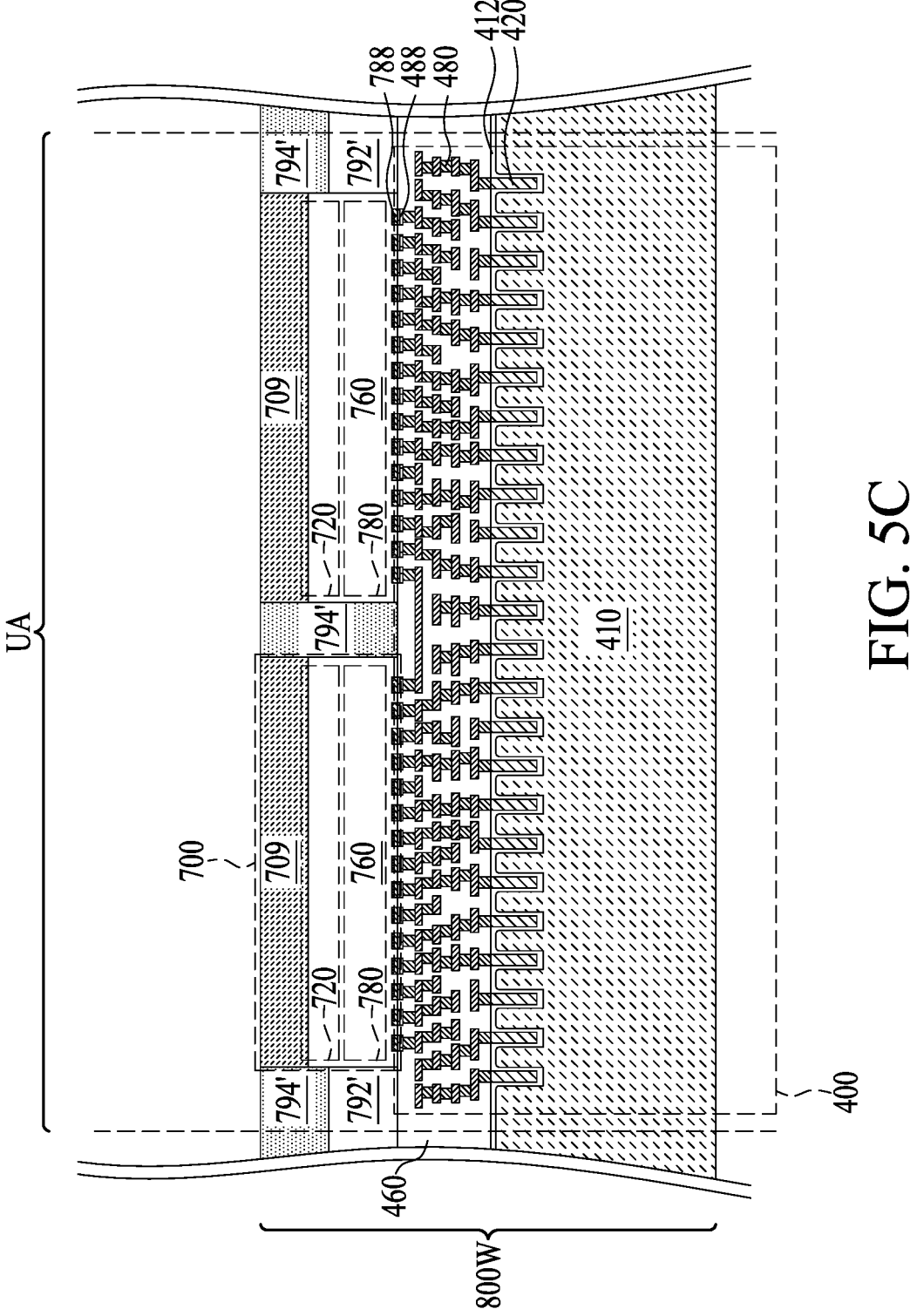
FIG. 5C is a vertical cross-sectional view of the alternative embodiment of the exemplary structure of FIG. 5A according to an embodiment of the present disclosure.

Referring to FIG. 5C, an alternative configuration of the exemplary structure is illustrated, which can be derived from the alternative configuration of the exemplary structure illustrated in FIG. 4B by performing the processing steps described with reference to FIGS. 5A and 5B.

Figure 6:
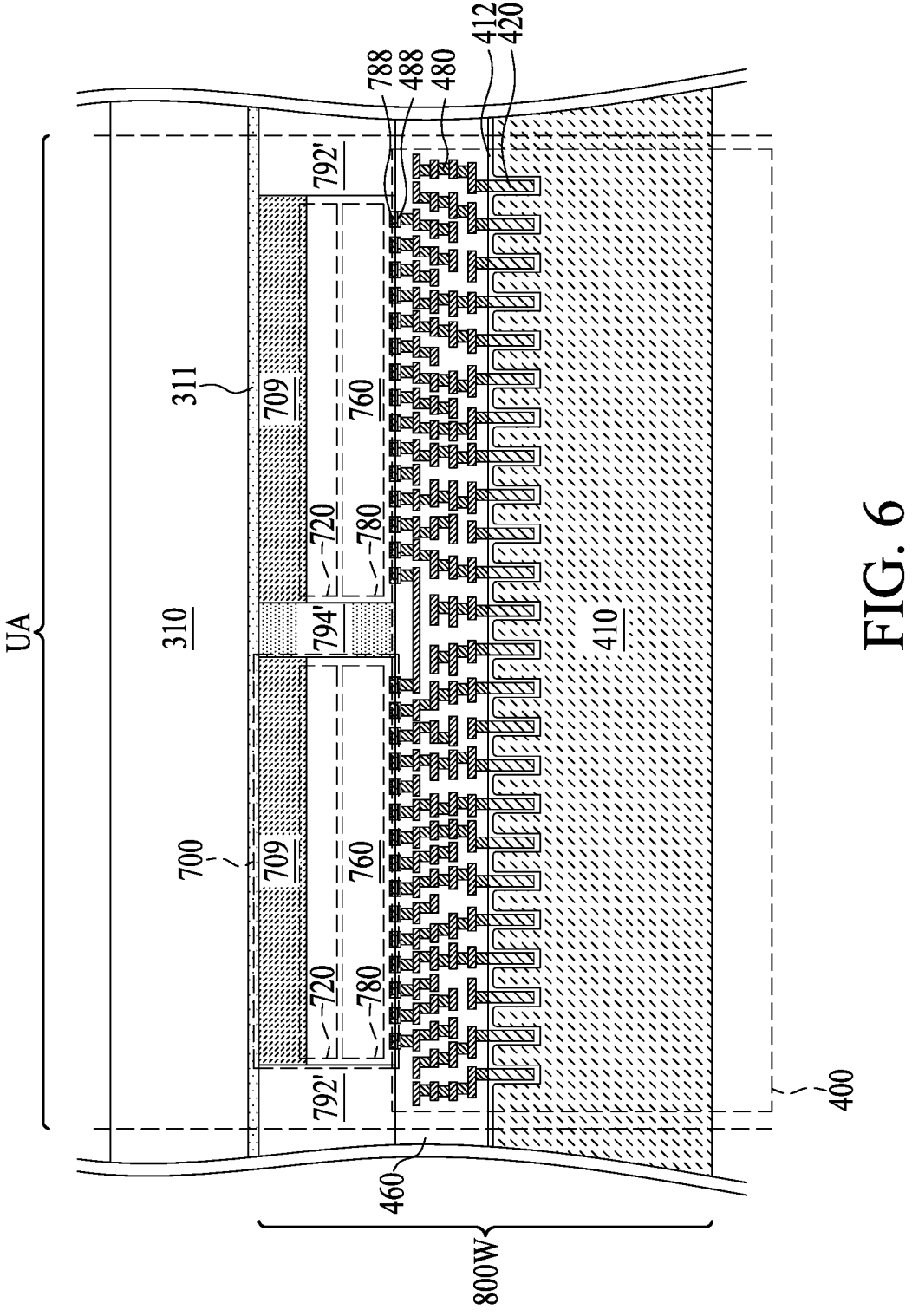
FIG. 6 is a vertical cross-sectional view of the intermediate structure after attaching a carrier wafer according to an embodiment of the present disclosure.

Referring to FIG. 6, an adhesive layer 311 may be applied to the top surfaces of the semiconductor dies 700 and to the top surface of the molding compound material layer 794'. A carrier wafer 310 can be attached to the adhesive layer 311. In one embodiment, the carrier wafer 310 may include an optically transparent substrate such as a glass substrate or a sapphire substrate, or may comprise a semiconductor substrate such as a silicon substrate. The diameter of the carrier wafer 310 may be the same as the diameter of the silicon wafer. The thickness of the carrier wafer 310 may be in a range from 500 microns to 2,000 microns, although lesser and greater thicknesses may also be used. In one embodiment, the adhesive layer 311 may be a light-to-heat conversion (LTHC) layer. Alternatively, the adhesive layer 311 may include a thermally decomposing adhesive material.

Figure 7:
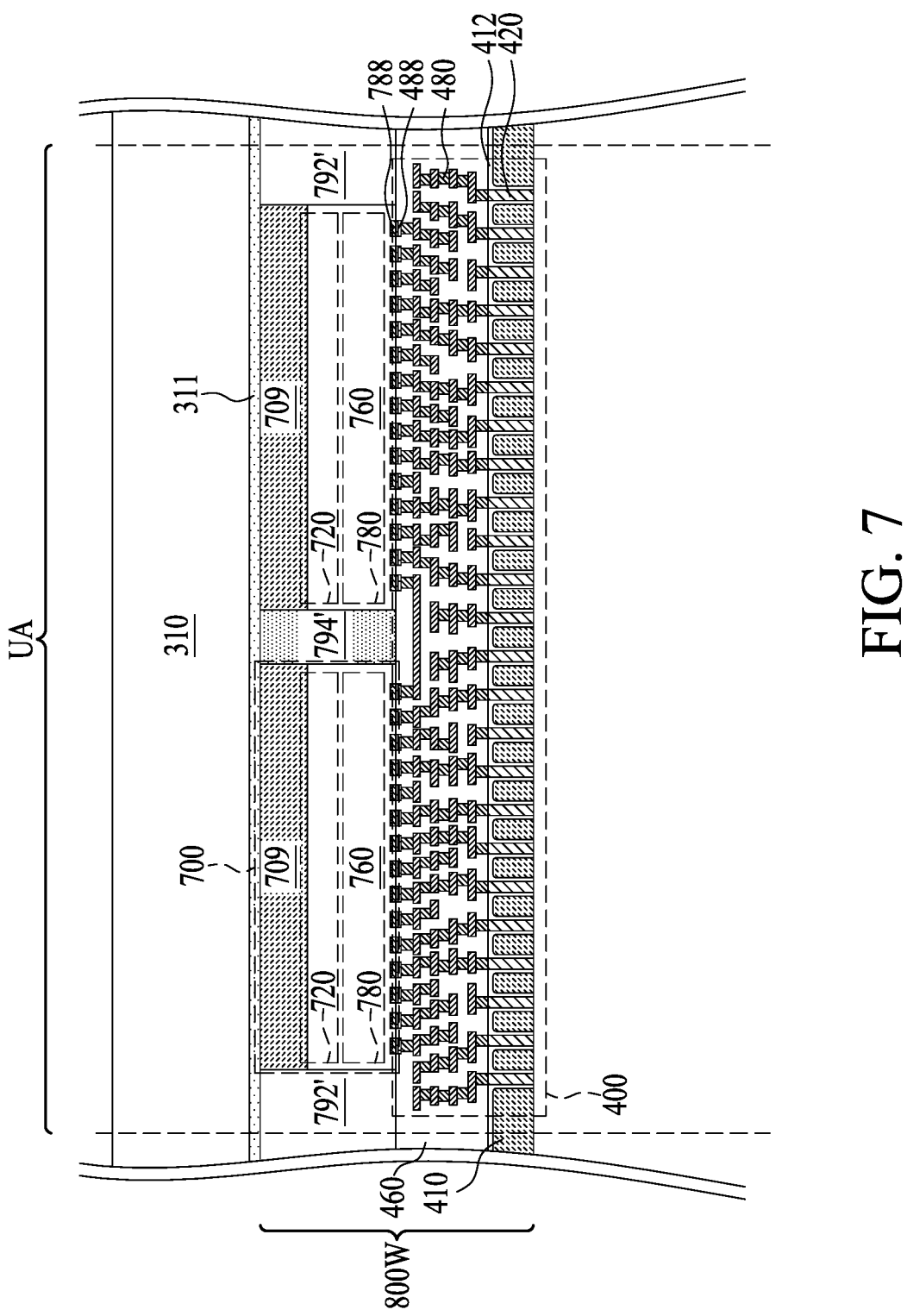
FIG. 7 is a vertical cross-sectional view of the intermediate structure after thinning the backside of the silicon substrate according to an embodiment of the present disclosure.

Referring to FIG. 7, a backside polishing process can be performed to remove the backside of the silicon wafer. The silicon substrate 410 can be removed by grinding, polishing, an anisotropic etch process, an isotropic etch process, or a combination thereof. In one embodiment, a plurality of silicon removal processes can be sequentially performed to remove the backside portion of the silicon wafer until the bottom surfaces of the TSV structures 420 are exposed. The front insulating liner 412 and/or the TSV structures 420 may be used as polishing stop structures and/or etch stop structures. In one embodiment, the plurality of silicon removal processes may comprise a terminal process that uses a chemical mechanical polishing process after which bottom surfaces of the TSV structures 420 may be exposed.

Figure 8:
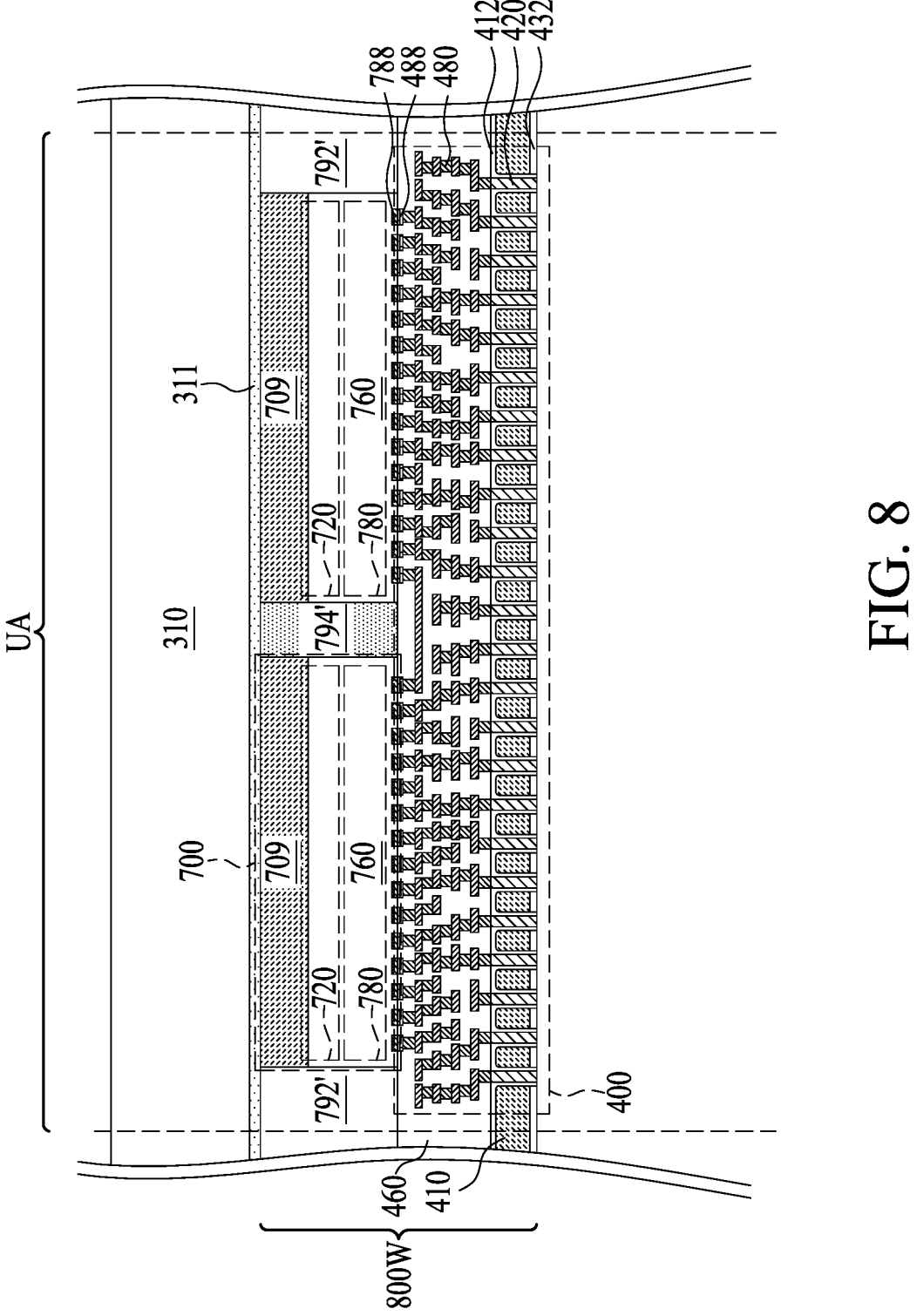
FIG. 8 is a vertical cross-sectional view of the intermediate structure after formation of a backside insulating layer according to an embodiment of the present disclosure.

Referring to FIG. 8, the backside silicon surface of the silicon substrate 410 may be vertically recessed, for example, by performing an isotropic etch process that removes silicon selective to the front insulating liner 412 and the TSV structures 420. In an illustrative example, a wet etch process using potassium hydroxide may be performed to vertically recess the backside silicon surface of the silicon substrate 410 by a vertical recess distance. The vertical recess distance may be in a range from 100 nm to 500 nm, although lesser and greater vertical recess distances may also be used.

An insulating material such as silicon oxide can be deposited on the recessed backside surface of the silicon substrate 410 to form a backside insulating layer 432. The thickness of the backside insulating layer 432 may be about the same as, or may be greater than, the vertical recess distance of the backside silicon surface of the silicon substrate 410. A planarization process, such as a polishing process, may be performed to remove portions of the backside insulating layer 432 that protrude downward below the horizontal plane including the bottom surfaces of the TSV structures 420. In this embodiment, the bottom surfaces of the TSV structures 420 may be coplanar with the physically exposed distal surface of the backside insulating layer 432.

Figure 9:
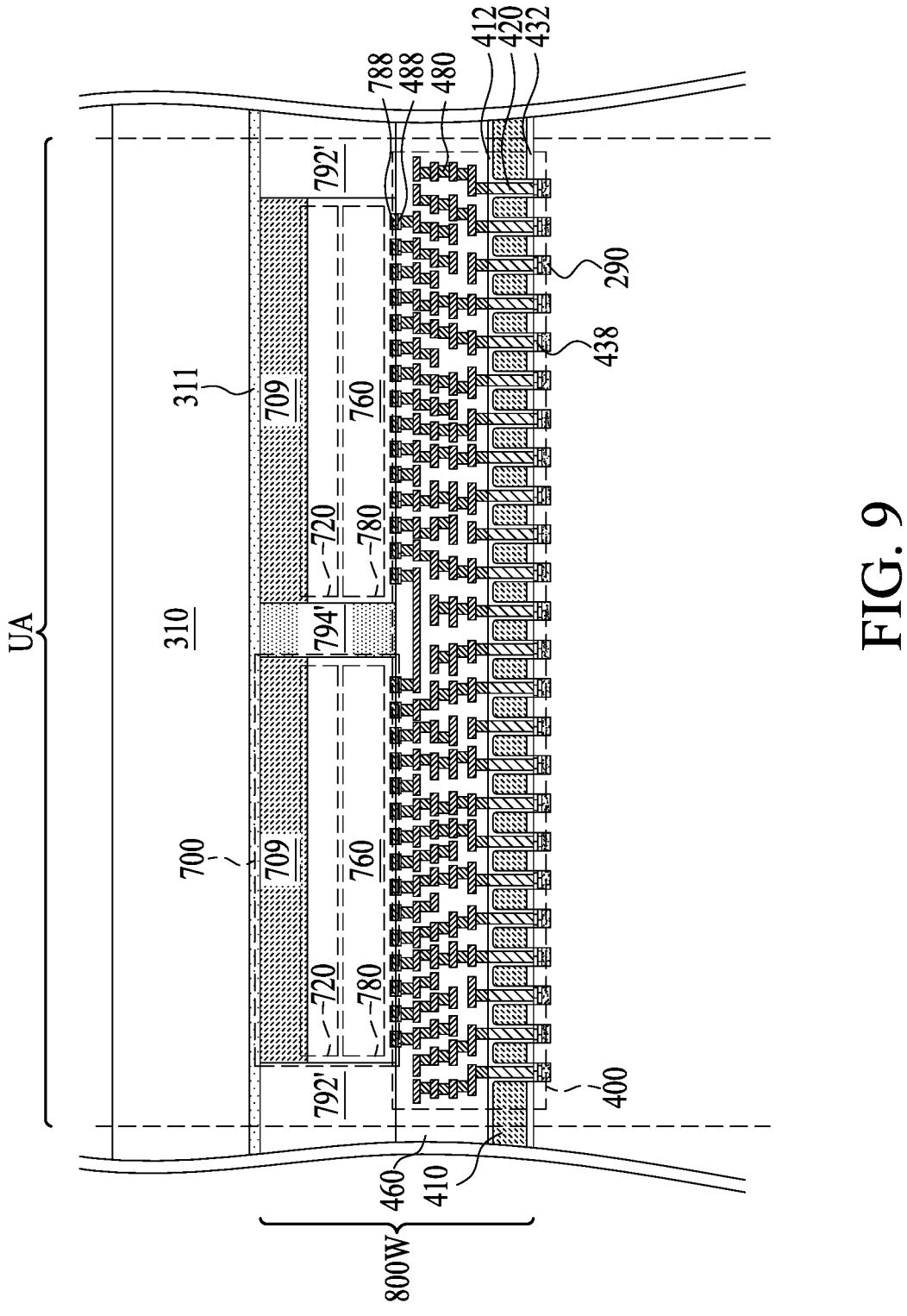
FIG. 9 is a vertical cross-sectional view of the intermediate structure after formation of backside metal bonding pads and solder material portions according to an embodiment of the present disclosure.

Referring to FIG. 9, backside metal bonding pads 438 and solder material portions 290 may be formed on the physically exposed bottom surfaces of the TSV structures 420. In an illustrative example, a metallic material layer stack including underbump metallurgy (UBM) material layer can be deposited on the bottom surfaces of the TSV structures 420 and on the distal surface of the backside insulating layer 432. A solder material layer can be deposited on the metallic material layer stack. A photoresist layer (not shown) may be applied and lithographically patterned on the solder material layer, and the pattern in the photoresist layer may be transferred through the solder material layer and the metallic material layer stack to form an array of solder material portions 290 and an array of backside metal bonding pads 438 on each silicon interposer 400. The photoresist layer may be subsequently removed, for example, by ashing.

Figure 10:
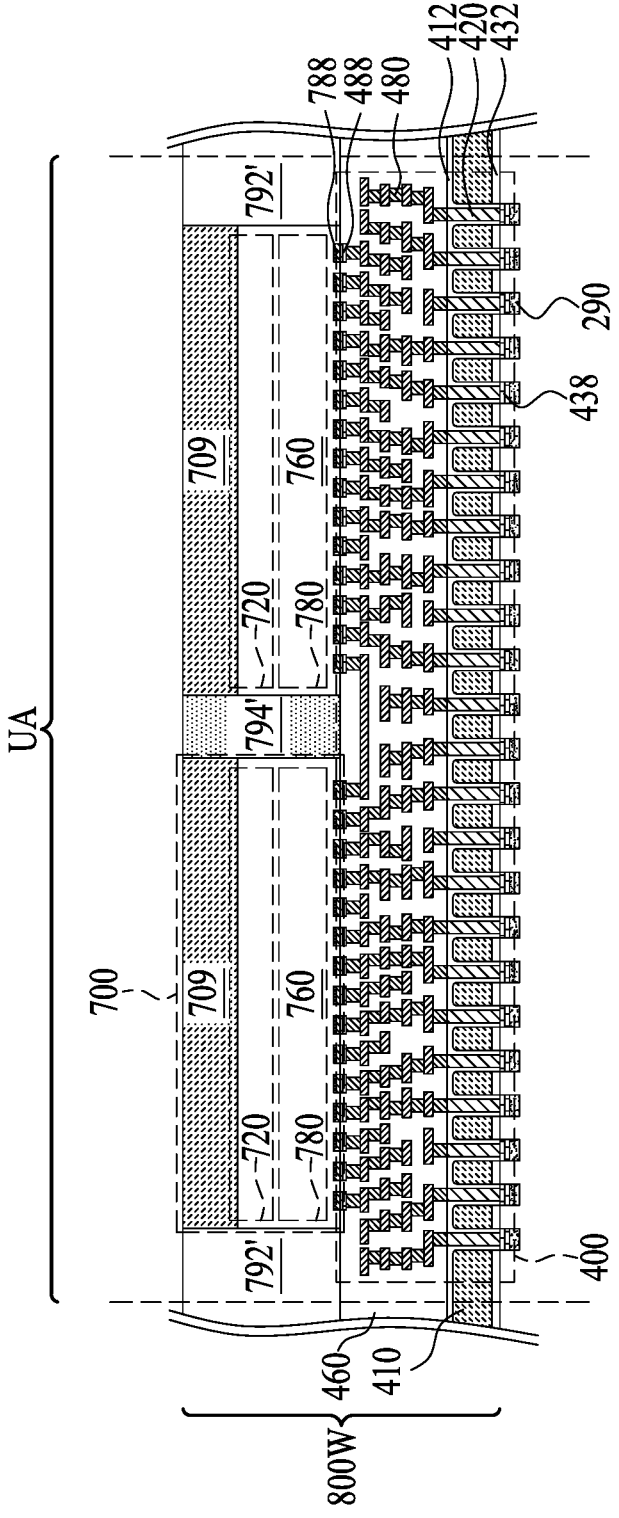
FIG. 10 is a vertical cross-sectional view of the intermediate structure after detaching the carrier wafer according to an embodiment of the present disclosure.

Referring to FIG. 10, the carrier wafer 310 may be detached from the reconstituted wafer 800W. In some embodiments, the carrier wafer 310 and the adhesive layer 311 may be removed by backside grinding. Alternatively, the carrier wafer 310 includes an optically transparent material and the adhesive layer 311 comprises a light-to-heat conversion material, and irradiation through the carrier wafer 310 may be used to detach the carrier wafer 310. If the adhesive layer 311 comprises a thermally decomposable adhesive material, an anneal process or a laser irradiation may be used to detach the carrier wafer 310. A suitable clean process may be performed to remove residual portions of the adhesive layer 311. The reconstituted wafer 800W includes a two-dimensional array of silicon interposers 400, and further includes a two-dimensional array of sets of at least one semiconductor die 700 that are bonded to a respective silicon interposer 400.

Figure 11A:
FIG. 11A is a vertical cross-sectional view of a fan-out package after dicing the exemplary structure of FIG. 10.
Figure 11B:
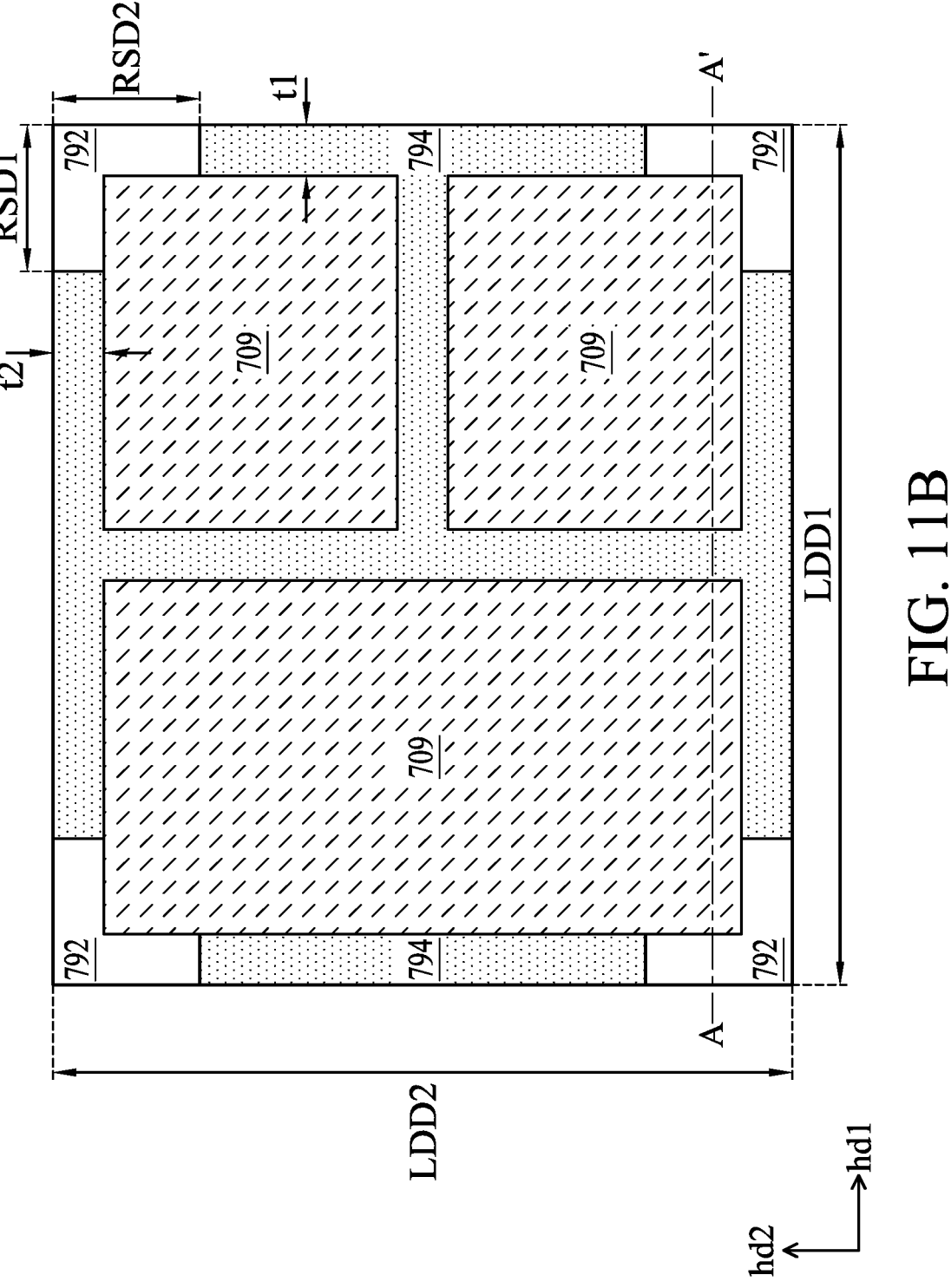
FIG. 11B is a top-down view of the fan-out package of FIG. 11A.

Referring to FIGS. 11A and 11B, the reconstituted wafer 800W may be diced along dicing channels by performing a dicing process. The dicing channels correspond to the boundaries between neighboring pairs of unit areas UA. Each diced unit from the reconstituted wafer comprises a fan-out package 800. Each diced portion of the molding compound material layer 794' constitutes a molding compound die frame portion 794. Each diced portion of the in-process frame edge reinforcement structures 792' constitutes a frame edge reinforcement structure 792. Each contiguous assembly of a molding compound die frame portion 794 and a plurality of frame edge reinforcement structures 792 constitute a composite die frame 790. Generally, each in-process frame edge reinforcement structure 792' may be divided into a plurality of frame edge reinforcement structures 792 that belong to different fan-out packages 800. In one embodiment, an in-process frame edge reinforcement structure 792' may be divided into four frame edge reinforcement structures 792 that are incorporated into four different fan-out packages. In an illustrative example, a cross-shaped in-process frame edge reinforcement structure 792' may be divided into four L-shaped frame edge reinforcement structures 792.

The diced portions of the reconstituted wafer comprise fan-out packages 800. Each fan-out package 800 comprises at least one semiconductor die 700, a silicon interposer 400, and a composite die frame 790. Generally, a composite die frame 790 may be formed around at least one semiconductor die 700 within each fan-out package 800. The composite die frame 790 includes a molding compound die frame portion 794 comprising a molding compound material and frame edge reinforcement structures 792 located at corners of the composite die frame 790 and comprising a material having a lower coefficient of thermal expansion at 20 degrees Celsius than the molding compound material.

In one embodiment, the composite die frame 790 laterally surrounds the at least one semiconductor die 700 and contacts a horizontal surface of a topmost one of the interposer dielectric material layers 460. In one embodiment, within each fan-out package 800, one, a plurality, and/or each of the frame edge reinforcement structures 792 comprises at least one outer sidewall surface that is physically exposed to a gas-phase ambient (such as air). In one embodiment, within each fan-out package 800, one, a plurality, and/or each of the frame edge reinforcement structures 792 comprises at least one inner sidewall surface that is in direct contact with one of the at least one semiconductor die 700. In one embodiment, within each fan-out package 800, one, a plurality, and/or each of the frame edge reinforcement structures 792 comprises a proximal horizontal surface in direct contact with a horizontal surface of the interposer dielectric material layers 460. In one embodiment, within each fan-out package 800, one, a plurality, and/or each of the frame edge reinforcement structures 792 comprises a pair of vertically-extending sidewalls in direct contact with vertical surfaces of the molding compound die frame portion 794.

In one embodiment, within each fan-out package 800, one, a plurality, and/or each of the frame edge reinforcement structures 792 comprises a respective topmost in-die dielectric material layer 760 that is bonded to a topmost interposer dielectric material layer 460 selected from the interposer dielectric material layers 460 via dielectric-to-dielectric bonding. In one embodiment, the at least one semiconductor die 700 comprises a plurality of semiconductor dies 700 that are laterally spaced apart from one another by the molding compound die frame portion 794; and the frame edge reinforcement structures 792 are located entirely outside areas of gaps between neighboring pairs of the plurality of semiconductor dies 700 in a plan view. In one embodiment, the frame edge reinforcement structures 792 have a same height as each of the at least one semiconductor die 700.

In one embodiment, the frame edge reinforcement structures 792 comprise a material selected from an additional molding compound material, a die attachment film, an epoxy material, an underfill material, and a semiconductor material. In one embodiment, the at least one of the frame edge reinforcement structures 792 has an L-shaped horizontal cross-sectional shape.

Generally, a fan-out package 800 may have a rectangular shape, and may comprise a pair of first sidewalls that laterally extend along a first horizontal direction hd1 and a pair of second sidewalls that laterally extend along a second horizontal direction hd2 that is perpendicular to the first horizontal direction hd1. The fan-out package 800 may have a first die lateral dimension LDD1 along the first horizontal direction hd1, and a second die lateral dimension LDD2 along the second horizontal direction hd2. The second die lateral dimension LDD2 may be less than, the same as, or greater than, the first die lateral dimension LDD2.

A frame edge reinforcement structures 792 may have a first lateral dimension along the first horizontal direction hd1, which is herein referred to as a first reinforcement structure dimension RSD1; and may have a second lateral dimension along the second horizontal direction hd2, which is herein referred to as a second reinforcement structure dimension RSD2. In one embodiment, a laterally-extending region of the molding compound die frame portion 794 that laterally extends along the first horizontal direction hd1 may have a first thickness t1. In one embodiment, a laterally-extending portion of a frame edge reinforcement structure 792 that laterally extends along the second horizontal direction hd2 may have the first thickness t2. In one embodiment, a laterally-extending region of the molding compound die frame portion 794 that laterally extends along the second horizontal direction hd2 may have a second thickness t2. In one embodiment, a laterally-extending portion of a frame edge reinforcement structure 792 that laterally extends along the first horizontal direction hd1 may have the second thickness t1.

In some embodiments, the at least one semiconductor die 700 that is attached to a silicon interposer 400 may be a plurality semiconductor dies 700. In the illustrated configuration of FIGS. 11A and 11B, the at least one semiconductor die 700 comprises three semiconductor dies 700.

Figure 11C:
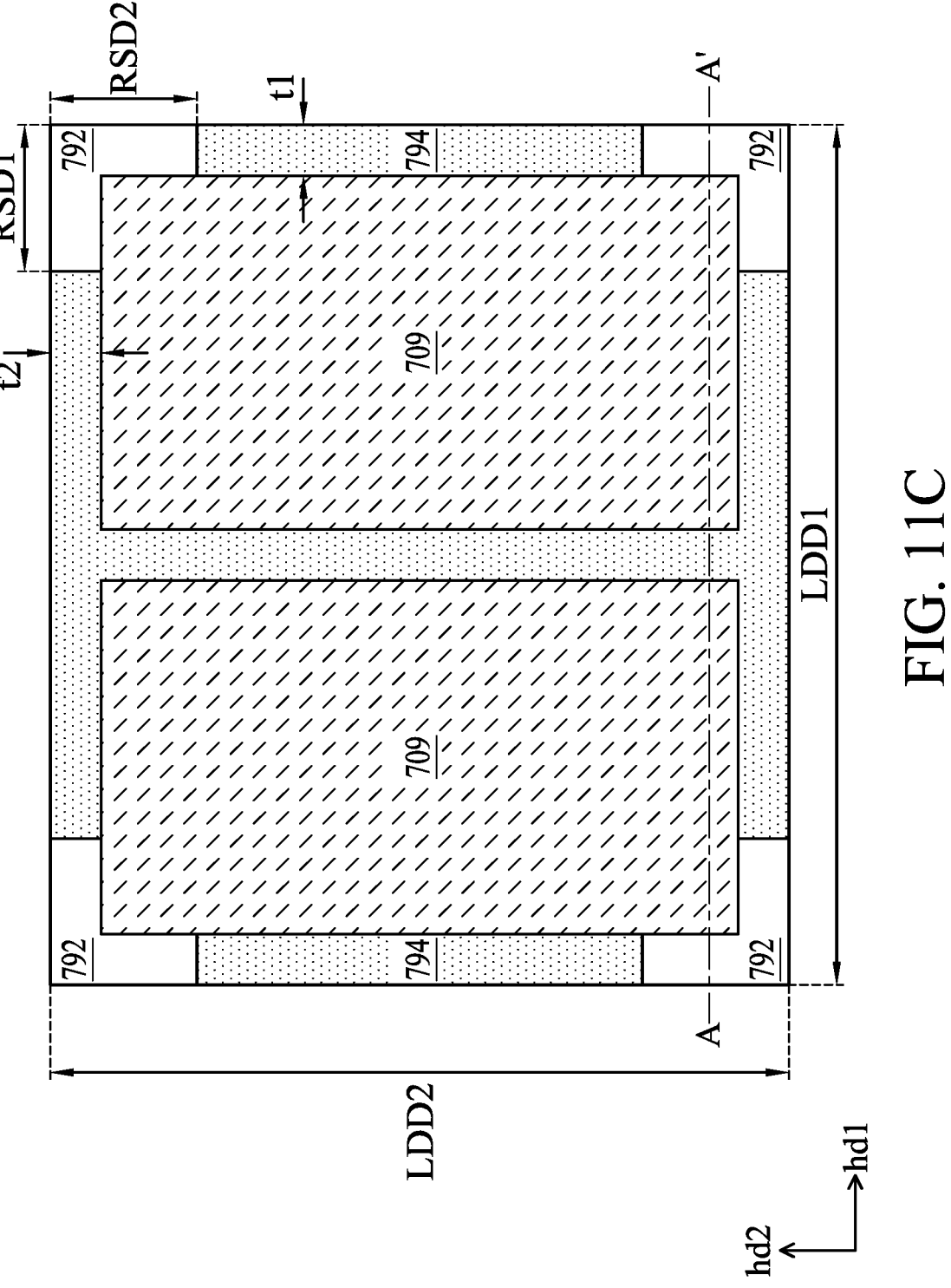
FIG. 11C is a top-down view of a first alternative configuration of the fan-out package of FIG. 11A.

Referring to FIG. 11C, a top-down view of a first alternative configuration of the fan-out package 800 is illustrated. In the first alternative configuration, the at least one semiconductor die 700 comprises two semiconductor dies 700. Generally speaking, the at least one semiconductor die 700 that is bonded to a silicon interposer 400 may comprise any number of semiconductor dies 700.

Figure 11D:
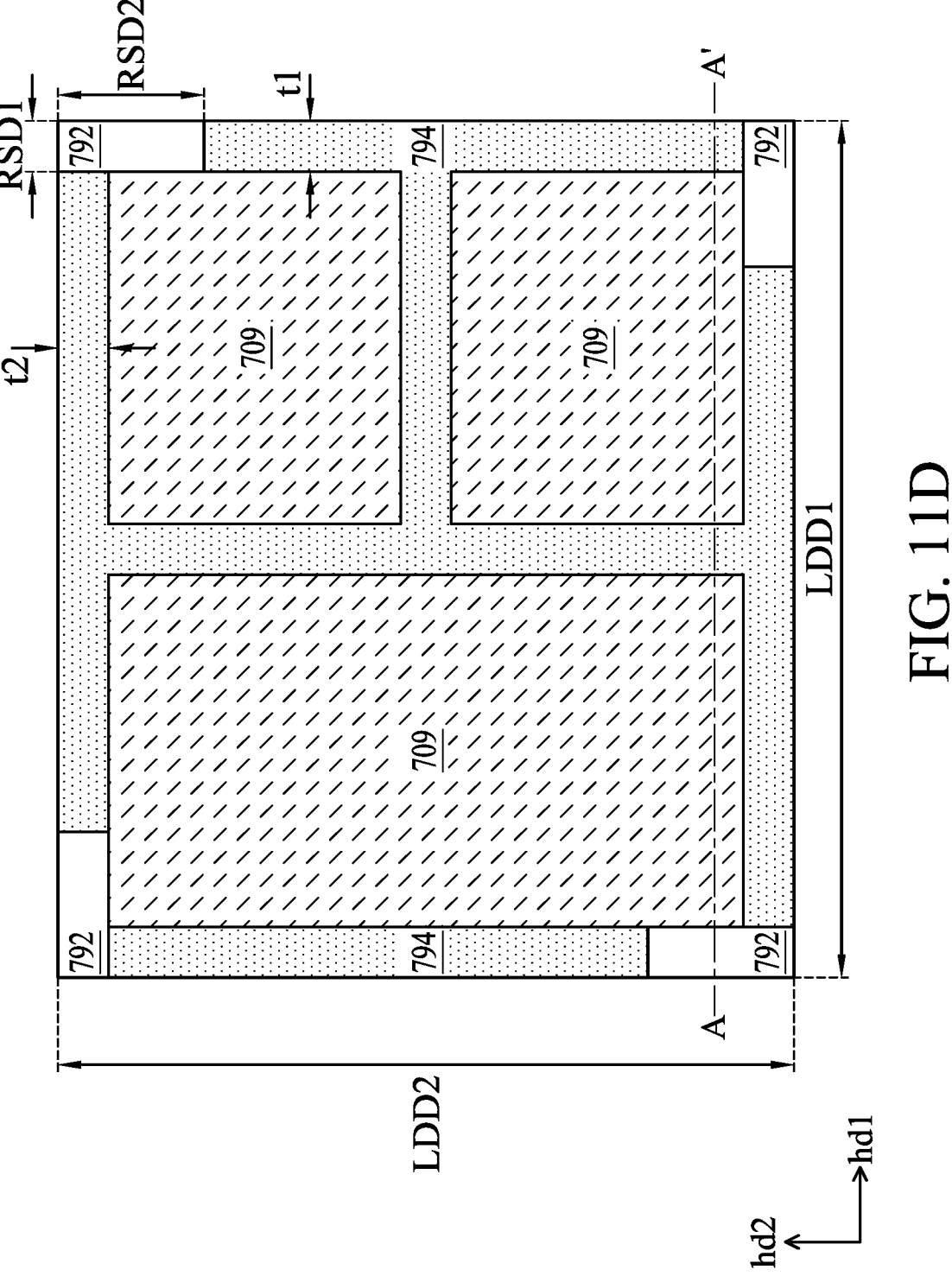
FIG. 11D is a top-down view of a second alternative configuration of the fan-out package of FIG. 11A.

Referring to FIG. 11D, a second alternative configuration of the fan-out package 800 can be derived from the fan-out packages of FIGS. 11A-11C by using rectangular frame edge reinforcement structures 792 having a width that is the same as the first thickness t1 or the second thickness t2. In this embodiment, a first reinforcement structure dimension RSD1 may be the same as the thickness t1, or a second reinforcement structure dimension RSD2 may be the same as the second thickness t2. In this embodiment, and in-process frame edge reinforcement structures 792 may have twice the length of a frame edge reinforcement structure 792, and may have a twice the width of the frame edge reinforcement structure 792.

Figure 11E:
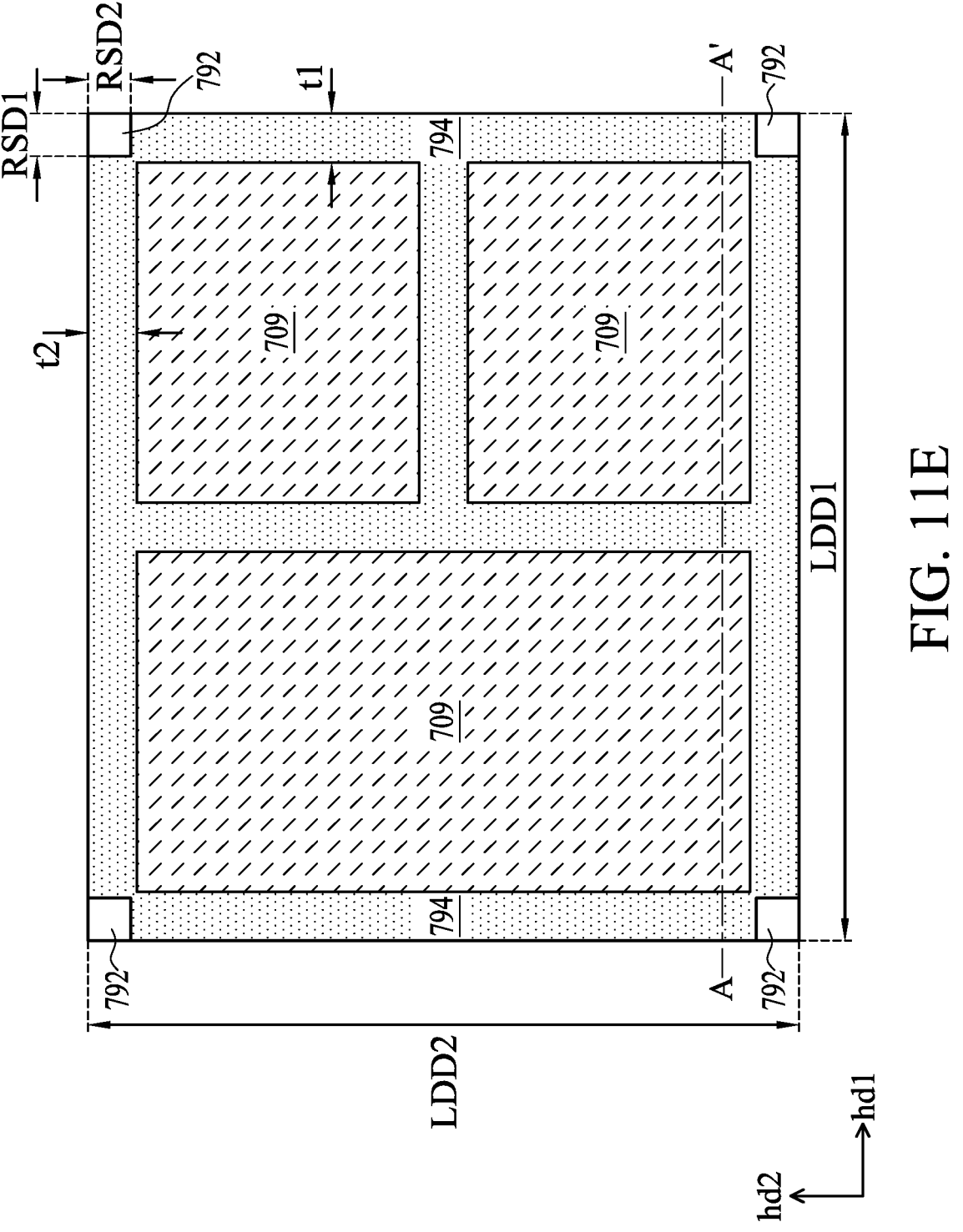
FIG. 11E is a top-down view of a third alternative configuration of the fan-out package of FIG. 11A.

Referring to FIG. 11E, a third alternative configuration of the fan-out package 800 may be derived from the fan-out packages of FIGS. 11A-11D by using rectangular frame edge reinforcement structures 792 such that a first reinforcement structure dimension RSD1 is less than the first thickness t1, and/or a second reinforcement structure dimension RSD2 is less than the second thickness t2. In this embodiment, the frame edge reinforcement structures 792 may be laterally spaced from the semiconductor dies 700 by a thin sidewall portion of the molding compound die frame portion 794. In this embodiment, and in-process frame edge reinforcement structures 792 may have twice the length of a frame edge reinforcement structure 792, and may have a twice the width of the frame edge reinforcement structure 792. Generally, at least one of the frame edge reinforcement structures 792 may have a rectangular horizontal cross-sectional shape.

Figure 11F:
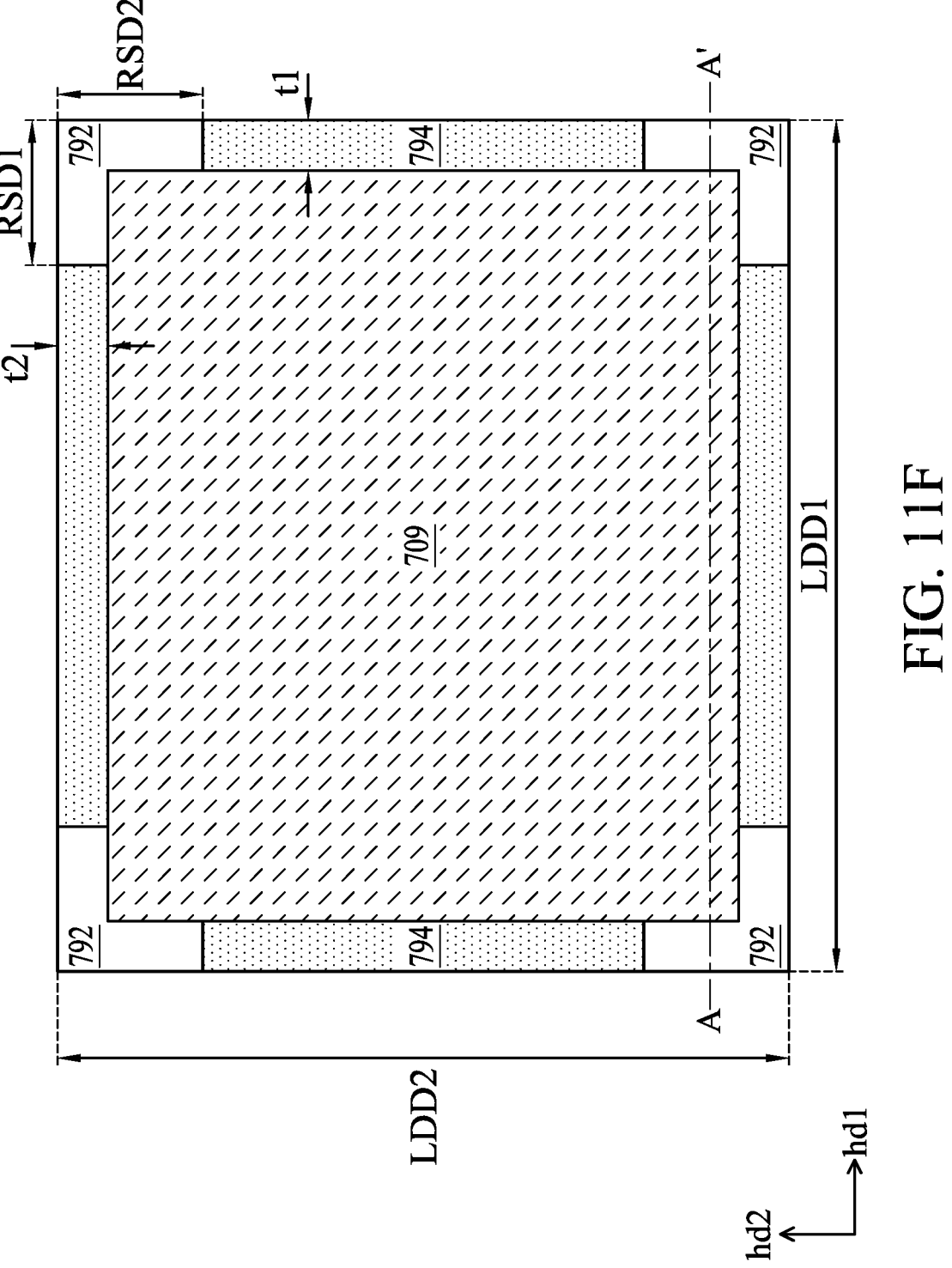
FIG. 11F is a top-down view of a fourth alternative configuration of the fan-out package of FIG. 11A.

Referring to FIG. 11F, a fourth alternative configuration of the fan-out package 800 is illustrated, which may be derived from any of the fan-out packages of FIGS. 11A-111D by using a single semiconductor die 700 in lieu of a plurality of semiconductor dies 700.

Figure 11G:
FIG. 11G is a vertical cross-sectional view of an alternative configuration of the fan-out package.

Referring to FIG. 11G, an alternative configuration of the fan-out package 800 is illustrated, which can be derived from any of the fan-out packages of FIGS. 11A-11D by using in-process frame edge reinforcement structure 792' having a lesser height than the height of the semiconductor dies 700 as illustrated in FIG. 5C. In this embodiment, each of the frame edge reinforcement structures 792 has a heigh that is less than the height of the at least one semiconductor die 700. In one embodiment, one, a plurality, and/or each, of the frame edge reinforcement structures 792 comprises a distal horizontal surface (i.e., a horizontal surface that is distal from the interface between the silicon interposer 400 and the semiconductor dies 700) which is in direct contact with a horizontal surface of the molding compound die frame portion 794.

Generally, the height of each frame edge reinforcement structure 792 may be in a range from 1 micron to 100% of the thickness of the semiconductor dies 700. In some embodiments, the height of each frame edge reinforcement structures 792 may be less than 100%, and/or less than 80%, and/or less than 60%, and/or less than 40%, of the thickness of the semiconductor dies 700. The first reinforcement structure dimension RSD1 may be greater than 1 micron and may be less than 50% of the first die lateral dimension LDD1. The second reinforcement structure dimension RSD2 may be greater than 1 micron and may be less than 50% of the second die lateral dimension LDD2.

Figure 12:
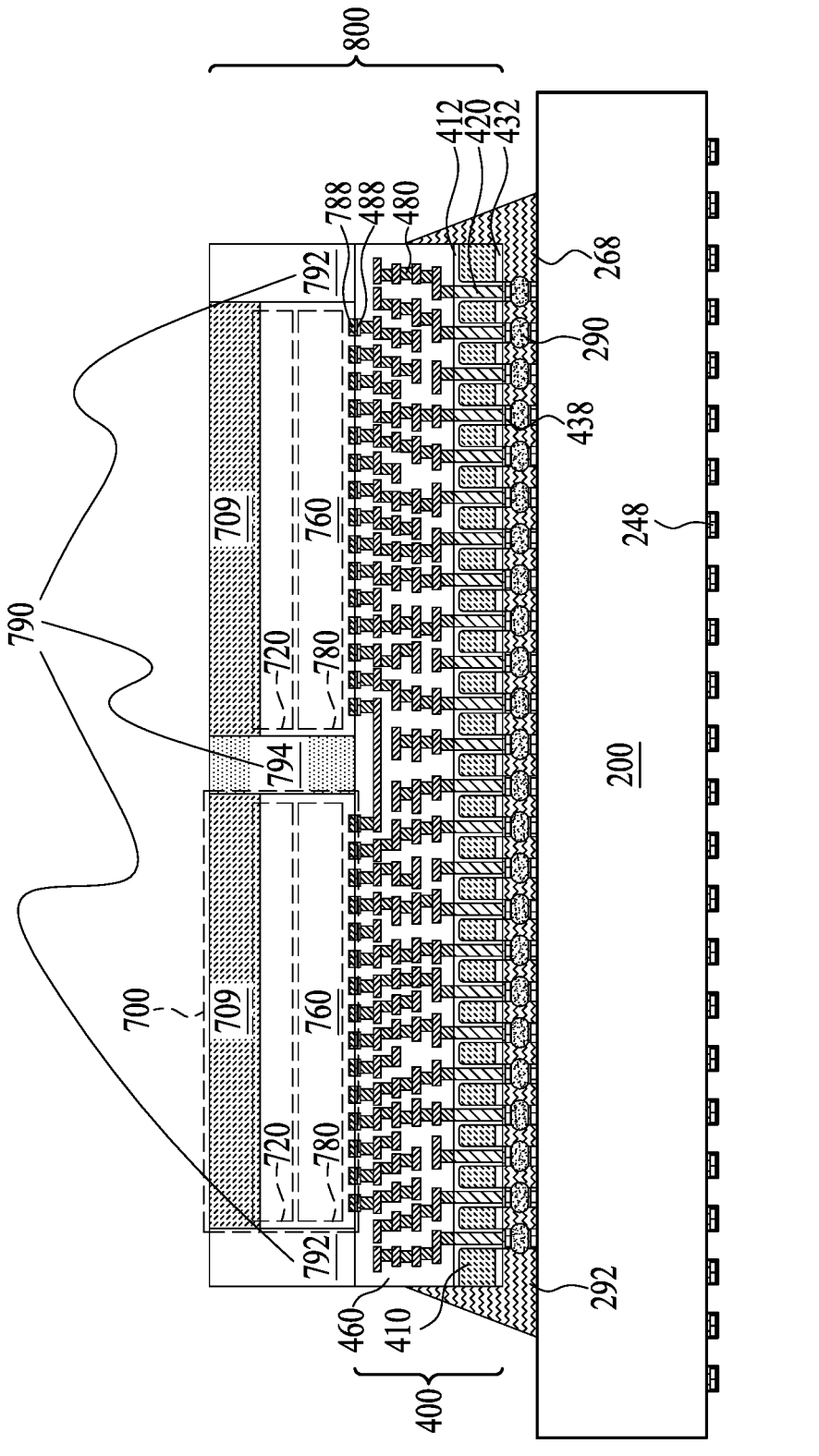
FIG. 12 is a vertical cross-sectional view of an exemplary structure including an assembly of the fan-out package and a packaging substrate according to an embodiment of the present disclosure.

Referring to FIG. 12, a packaging substrate 200 may be bonded to the fan-out package 800, which may be any of the fan-out packages 800 illustrated in FIGS. 11A-11G. The packaging substrate 200 may be a cored packaging substrate including a core substrate, or a coreless packaging substrate that does not include a package core. Alternatively, the packaging substrate 200 may include a system-on-integrated packaging substrate (SoIS) including redistribution layers, dielectric interlayers, and/or at least one embedded interposer (such as a silicon interposer). Such a system-integrated packaging substrate may include layer-to-layer interconnections using solder material portions, microbumps, underfill material portions (such as molded underfill material portions), and/or an adhesion film. In some embodiments, the packaging substrate 200 may comprise a system-on-integrated substrate package including a glass epoxy plate with an array of through-plate holes. An array of through-core via structures (not illustrated) including a metallic material may be provided in the through-plate holes. Each through-core via structure may, or may not, include a cylindrical hollow therein. Optionally, dielectric liners (not illustrated) may be used to electrically isolate the through-core via structures from the core substrate.

Substrate bonding pads 268 can be provided on one side of the packaging substrate 200, and board-side bonding pads 248 can be provided on another side of the packaging substrate 200. The fan-out package 800 may be attached to the packaging substrate 200 using the second solder material portions, which are herein referred to interposer-substrate-bonding (ISB) solder material portions 290. Specifically, each of the ISB solder material portions 290 may be bonded to a respective one of the substrate bonding pads 268 and to a respective one of the backside metal bonding pads 438 located on the silicon interposer 400. A reflow process may be performed to reflow the ISB solder material portions 290 such that each ISB solder material portion 290 may be bonded to a respective one of the substrate bonding pads 268 and to a respective one of the backside metal bonding pads 438.

An underfill material may be applied into a gap between the silicon interposer 400 and the packaging substrate 200. The underfill material may comprise any underfill material known in the art. An underfill material portion may be formed around the ISB solder material portions 290 in the gap between the silicon interposer 400 and the packaging substrate 200. This underfill material portion is herein referred to as an interposer-substrate underfill material portion 292, or as an IP underfill material portion 292.

Figure 13:
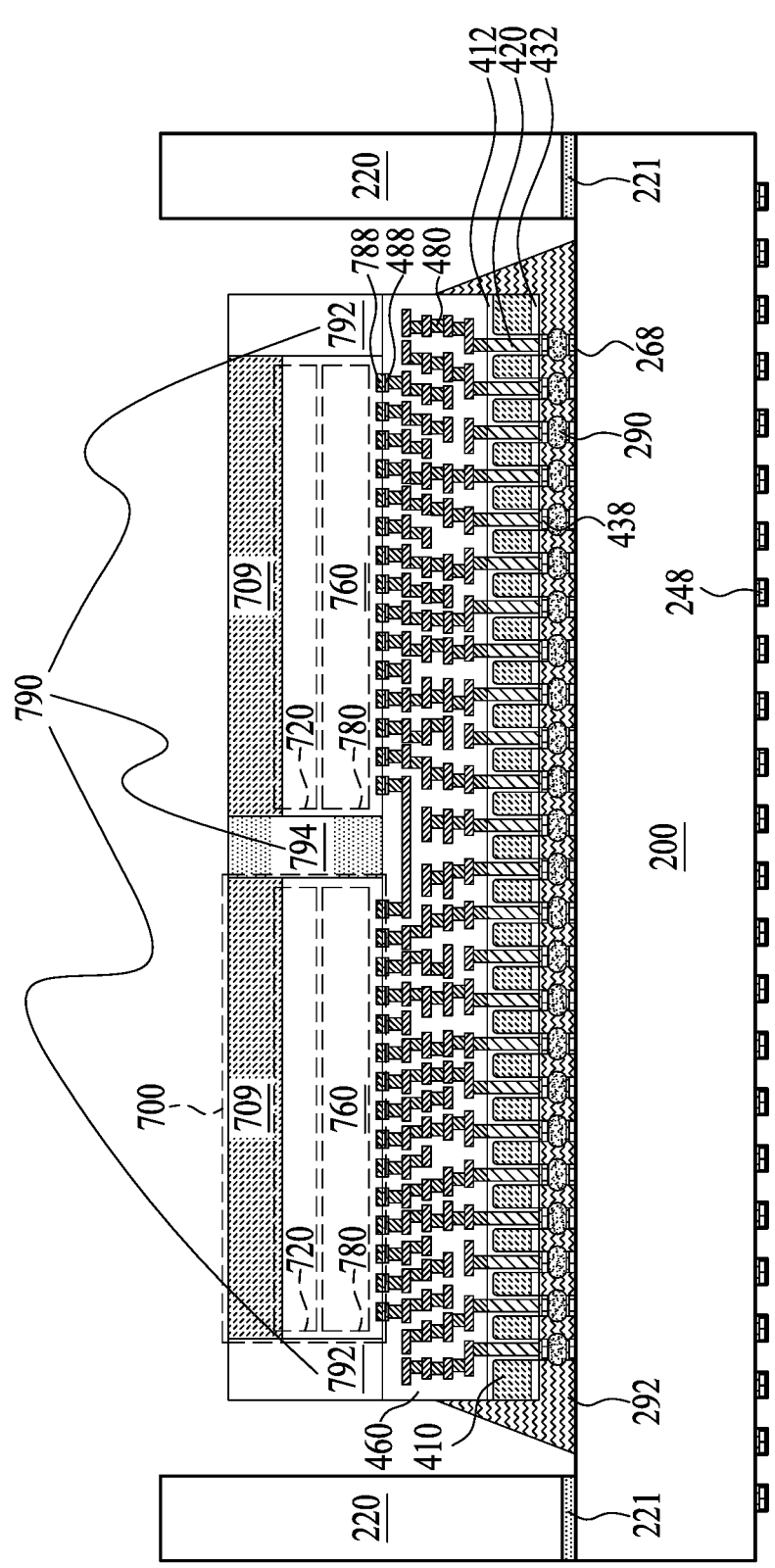
FIG. 13 is a vertical cross-sectional view of the exemplary structure after attaching a stabilization ring according to an embodiment of the present disclosure.

Referring to FIG. 13, a stiffener ring 220 (which is also referred to as a stabilization ring) may be attached to a peripheral portion of the top surface of the packaging substrate 200, for example, through an adhesive layer 221.

Figure 14:
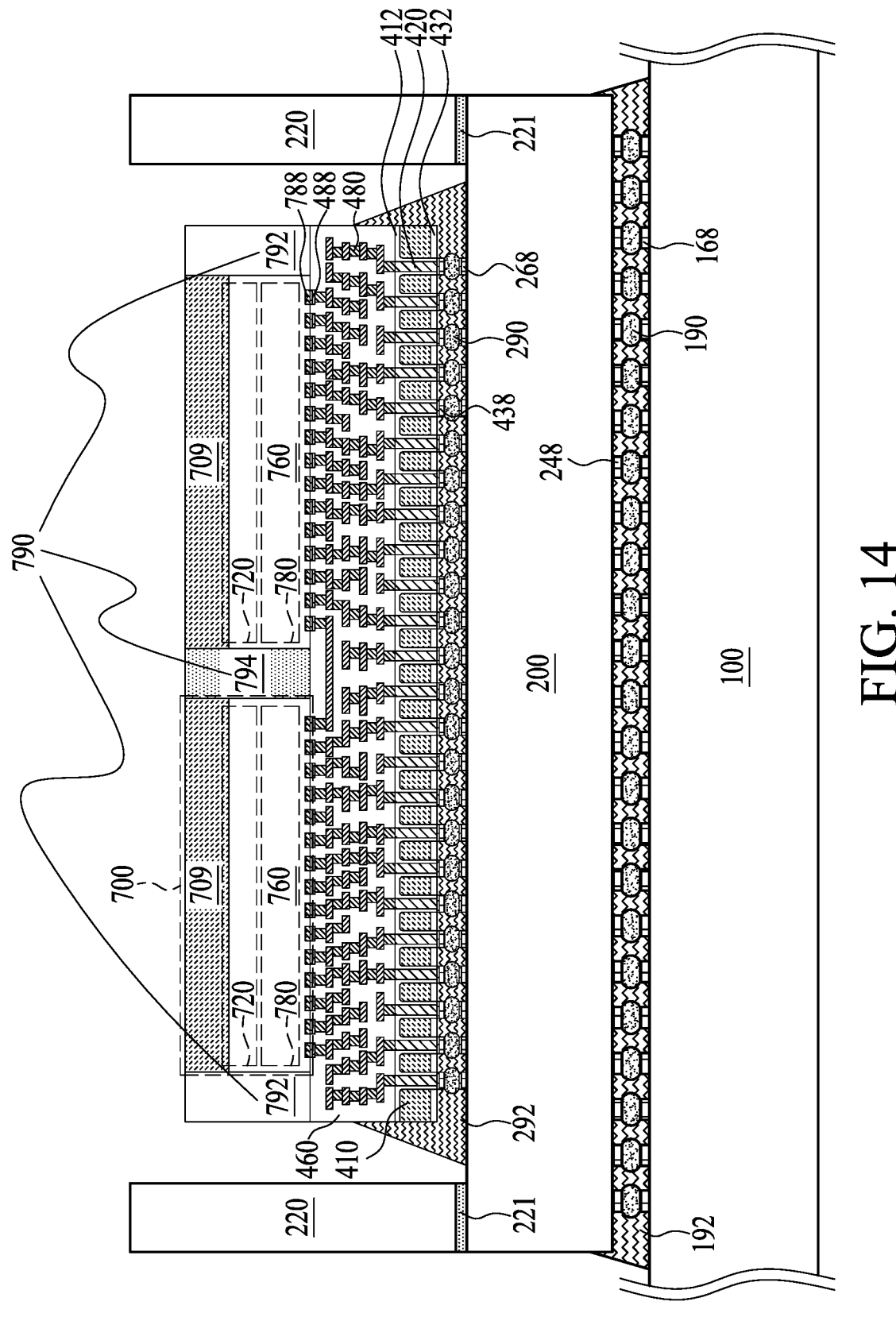
FIG. 14 is a vertical cross-sectional view of the exemplary structure after attaching the assembly including the fan-out package and the packaging substrate to a printed circuit board according to an embodiment of the present disclosure.

Referring to FIG. 14, a printed circuit board (PCB) 100 including a PCB substrate and PCB bonding pads 168 may be provided. The PCB 100 includes a printed circuitry (not shown) at least on one side of the PCB substrate. An array of solder joints 190 may be formed to bond the array of board-side bonding pads 248 to the array of PCB bonding pads 168. The solder joints 190 may be formed by disposing an array of solder balls between the array of board-side bonding pads 248 and the array of PCB bonding pads 168, and by reflowing the array of solder balls. An additional underfill material portion, which is herein referred to as a board-substrate underfill material portion 192 or a BS underfill material portion 192, may be formed around the solder joints 190 by applying and shaping an underfill material. The packaging substrate 200 is attached to the PCB 100 through the array of solder joints 190.

Figure 15:
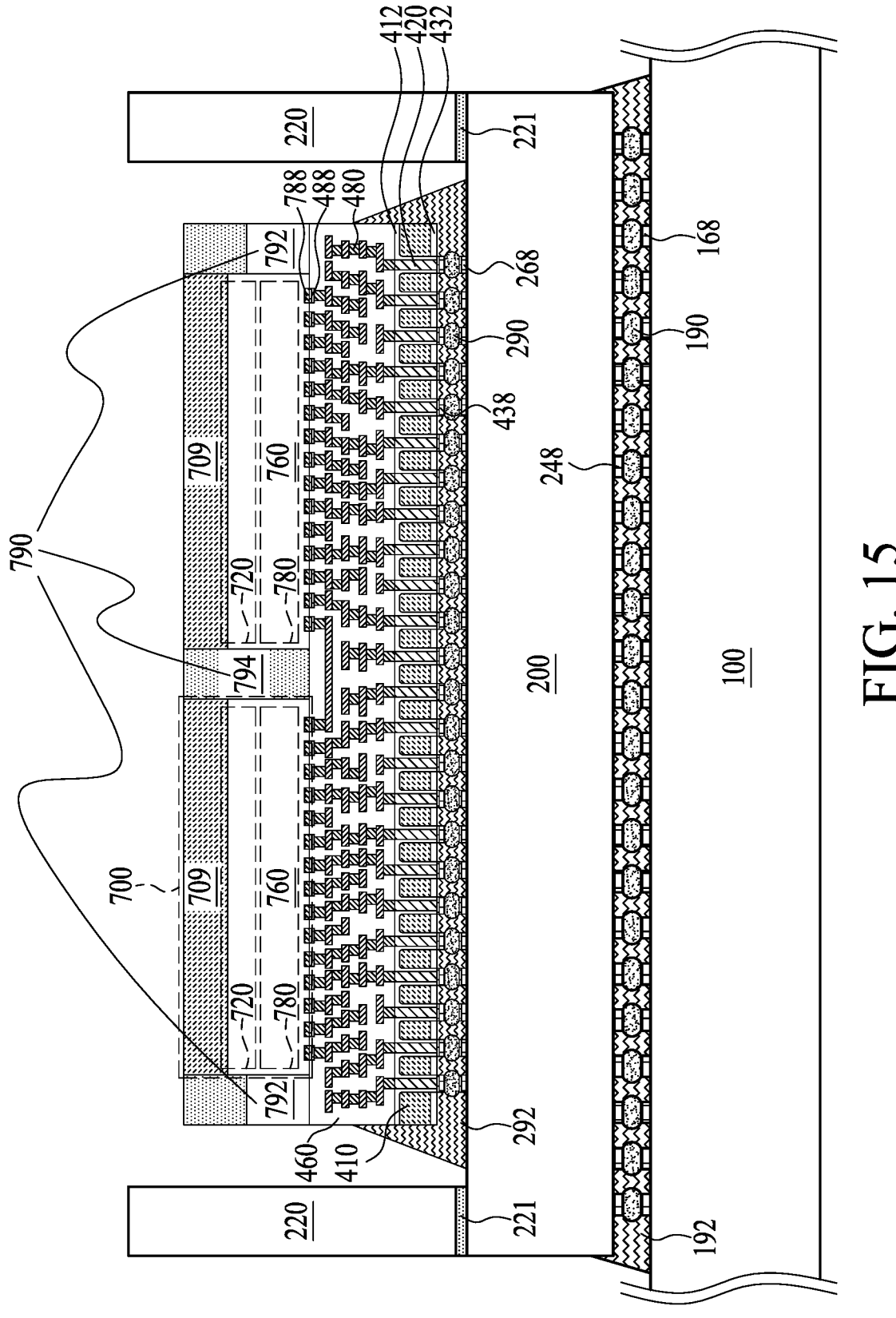
FIG. 15 is a vertical cross-sectional view of a first alternative configuration of the exemplary structure according to an embodiment of the present disclosure.

Referring to FIG. 15, a first alternative configuration of the exemplary structure according to an embodiment of the present disclosure is illustrated. The first alternative configuration may be derived from the exemplary structure illustrated in FIG. 14 by using frame edge reinforcement structures 792 having a lesser height than the height of the semiconductor dies 700.

Figure 16:
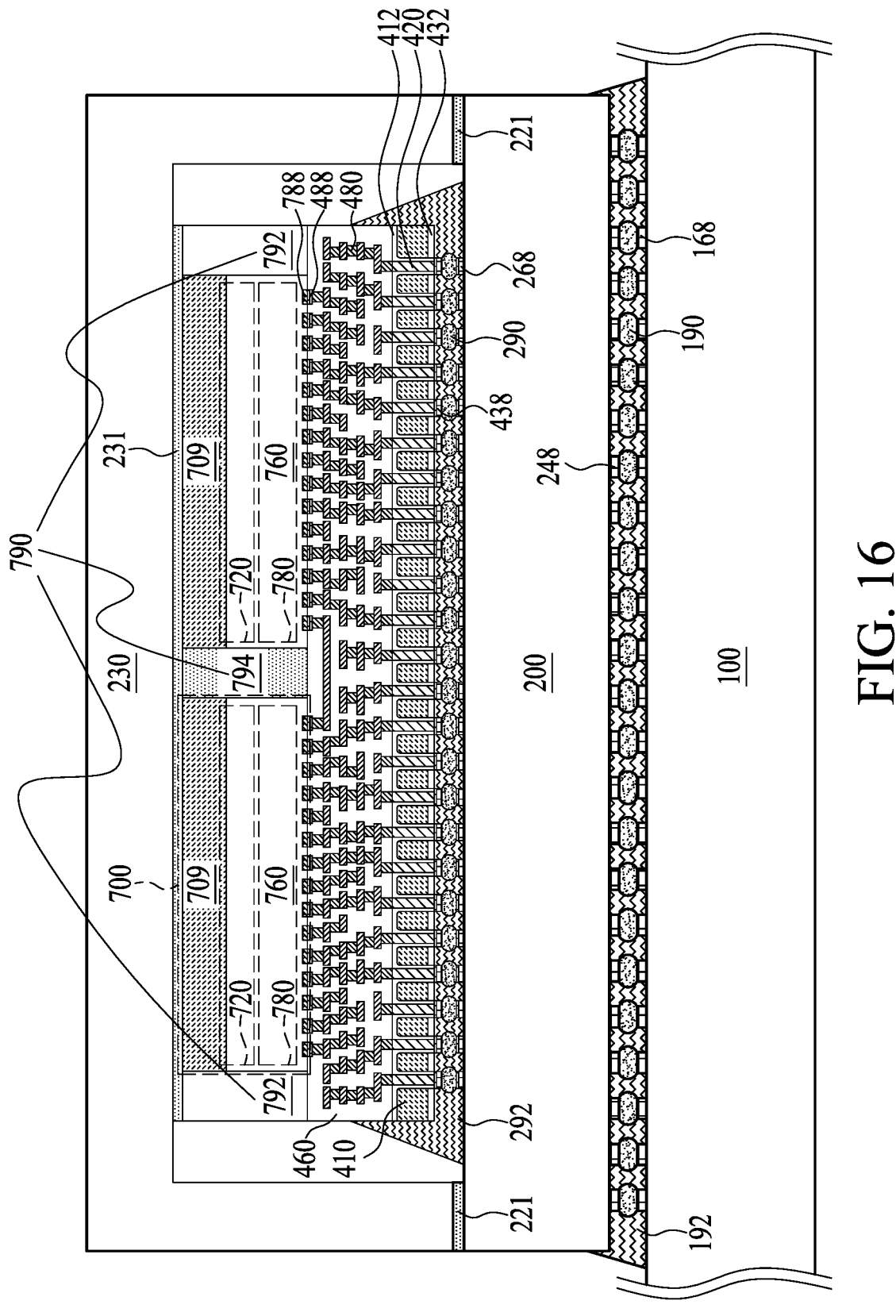
FIG. 16 is a vertical cross-sectional view of a second alternative configuration of the exemplary structure according to an embodiment of the present disclosure.

Referring to FIG. 16, a second alternative configuration of the exemplary structure according to an embodiment of the present disclosure is illustrated. The second alternative configuration may be derived from the exemplary structure illustrated in FIG. 14 by using a capping structure 230 in lieu of a stiffener ring 220. In this embodiment, a thermally conductive paste 231 may be applied between the top surface of the semiconductor dies 700 and the bottom surface of a horizontally-extending portion of the capping structure 230.

Figure 17:
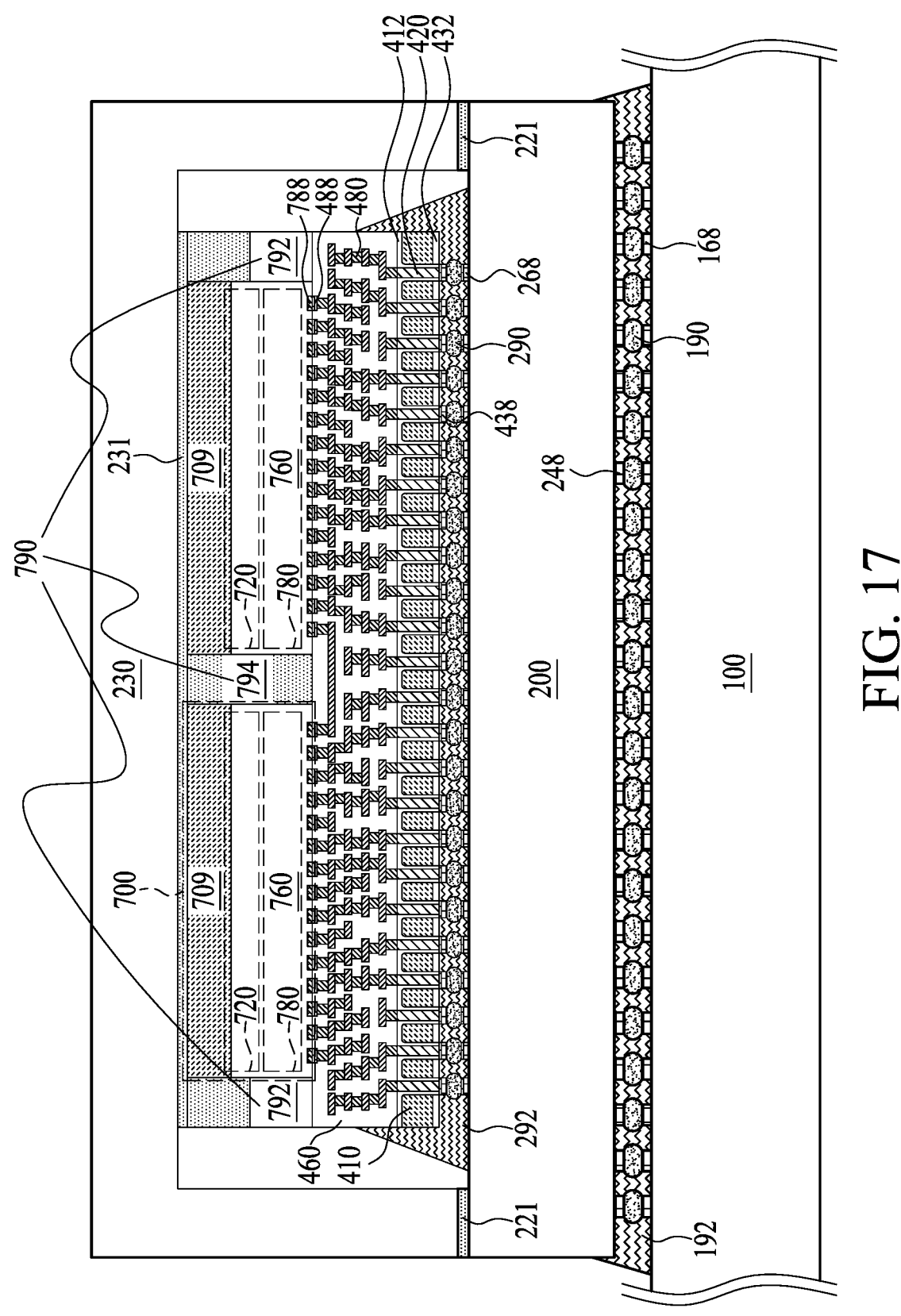
FIG. 17 is a vertical cross-sectional view of a third alternative configuration of the exemplary structure according to an embodiment of the present disclosure.

Referring to FIG. 17, a third alternative configuration of the exemplary structure according to an embodiment of the present disclosure is illustrated. The third alternative configuration may be derived from the first alternative configuration of the exemplary structure illustrated in FIG. 15 by using a capping structure 230 in lieu of a stiffener ring 220. In this embodiment, a thermally conductive paste 231 may be applied between the top surface of the semiconductor dies 700 and the bottom surface of a horizontally-extending portion of the capping structure 230.

Referring to FIG. 18, a flowchart illustrates steps for forming a device structure according to an embodiment of the present disclosure.

Referring to step 1810 and FIGS. 1A and 1B, a structure is provided, which comprises a silicon interposer 400 including a portion of a silicon substrate 410, through-silicon via structures 420 vertically extending through the silicon substrate 410, and interposer dielectric material layers 460 having formed therein interposer metal interconnect structures 480 and die-side interposer bonding pads 488.

Referring to step 1820 and FIGS. 2A and 3B, at least one semiconductor die 700 comprising in-die bonding pads 788 is bonded to the silicon interposer 400 such that the in-die bonding pads 788 are bonded to the die-side interposer bonding pads 488.

Referring to step 1830 and FIGS. 3A-17, a composite die frame 790 is formed around the at least one semiconductor die 700. The composite die frame 790 includes a molding compound die frame portion 794 comprising a molding compound material and frame edge reinforcement structures 792 located at corners of the composite die frame 790 and comprising a material having a lower coefficient of thermal expansion at 20 degrees Celsius than the molding compound material.

Referring to all drawings and according to various embodiments of the present disclosure, a device structure is provided, which comprises: an interposer 400 comprising interposer dielectric material layers 460 having formed therein interposer metal interconnect structures 480 and die-side interposer bonding pads 488; at least one semiconductor die 700 each comprising a respective set of semiconductor devices 720 and respective in-die dielectric material layers 760 having formed therein in-die metal interconnect structures 780 and in-die bonding pads 788, wherein the in-die bonding pads 788 are bonded to a respective one of the die-side interposer bonding pads 488 by metal-to-metal bonding; and a composite die frame 790 laterally surrounding the at least one semiconductor die 700 and contacting a horizontal surface of one of the interposer dielectric material layers 460, wherein the composite die frame 790 comprises a molding compound die frame portion 794 comprising a molding compound material and frame edge reinforcement structures 792 located at corners of the composite die frame 790 and comprising a material having a lower coefficient of thermal expansion at 20 degrees Celsius than the molding compound material.

In one embodiment, one of the frame edge reinforcement structures 792 comprises at least one outer sidewall surface that is physically exposed to a gas-phase ambient. In one embodiment, one of the frame edge reinforcement structures 792 comprises at least one inner sidewall surface that is in direct contact with one of the at least one semiconductor die 700. In one embodiment, one of the frame edge reinforcement structures 792 comprises a proximal horizontal surface in direct contact with a horizontal surface of the interposer dielectric material layers 460. In one embodiment, one of the frame edge reinforcement structures 792 comprises a distal horizontal surface in direct contact with a horizontal surface of the molding compound die frame portion 794. In one embodiment, one of the frame edge reinforcement structures 792 comprises a pair of vertically-extending sidewalls in direct contact with vertical surfaces of the molding compound die frame portion 794.

In one embodiment, each of the at least one semiconductor die 700 comprises a respective topmost in-die dielectric material layer 760 that is bonded to a topmost interposer dielectric material layer 460 selected from the interposer dielectric material layers 460 via dielectric-to-dielectric bonding. In one embodiment, the at least one semiconductor die 700 comprises a plurality of semiconductor dies 700 that are laterally spaced apart from one another by the molding compound die frame portion 794; and the frame edge reinforcement structures 792 are located entirely outside areas of gaps between neighboring pairs of the plurality of semiconductor dies 700 in a plan view. In one embodiment, the frame edge reinforcement structures 792 have a same height as each of the at least one semiconductor die 700. In one embodiment, the frame edge reinforcement structures 792 have a height that is less than a height of the at least one semiconductor die 700.

According to another aspect of the present disclosure, a device structure is provided, which comprises: a silicon interposer 400 comprising a silicon substrate 410, through-silicon via structures 420 vertically extending through the silicon substrate 410, and interposer dielectric material layers 460 having formed therein interposer metal interconnect structures 480 and die-side interposer bonding pads 488; at least one semiconductor die 700 comprising in-die bonding pads 788 that are bonded to the die-side interposer bonding pads 488; and a composite die frame 790 laterally surrounding the at least one semiconductor die 700 and including a molding compound die frame portion 794 comprising a molding compound material and frame edge reinforcement structures 792 located at corners of the composite die frame 790 and comprising a material having a lower coefficient of thermal expansion at 20 degrees Celsius than the molding compound material.

In one embodiment, the frame edge reinforcement structures 792 comprise a material selected from an additional molding compound material, a die attachment film, an epoxy material, an underfill material, and a semiconductor material. In one embodiment, at least one of the frame edge reinforcement structures 792 has an L-shaped horizontal cross-sectional shape. In one embodiment, at least one of the frame edge reinforcement structures 792 has a rectangular horizontal cross-sectional shape. In one embodiment, each of the at least one semiconductor die 700 comprises a respective set of semiconductor devices 720 and respective in-die dielectric material layers 760 having formed therein in-die metal interconnect structures 780 and in-die bonding pads 788, wherein the in-die bonding pads 788 are bonded to a respective one of the die-side interposer bonding pads 488 by metal-to-metal bonding.

The various embodiments of the present disclosure may be used to reduce the effective coefficient of thermal expansion for a die frame that laterally surrounds at least one semiconductor die 700. Silicon interposers 400 have a lower coefficient of thermal expansion than molding compound materials, and a mismatch between the thermal expansion between a die frame and a silicon interposer 400 can induce cracking in the molding compound material. A composite die frame 790 including a molding compound die frame portion 794 and frame edge reinforcement structures 792 having a lower coefficient of thermal expansion can reduce the magnitude of total thermal expansion at corner regions of the composite die frame 790, and thus, can suppress or reduce cracking in the composite die frame 790.

The foregoing outlines features of several embodiments so that those skilled in the art may better understand the aspects of the present disclosure. Each embodiment described using the term "comprises" also inherently discloses additional embodiments in which the term "comprises" is replaced with "consists essentially of" or with the term "consists of," unless expressly disclosed otherwise herein. Whenever two or more elements are listed as alternatives in a same paragraph of in different paragraphs, a Markush group including a listing of the two or more elements is also impliedly disclosed. Whenever the auxiliary verb "can" is used in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
an interposer comprising interposer dielectric material layers having formed therein interposer metal interconnect structures and die-side interposer bonding pads;

at least one semiconductor die each comprising a respective set of semiconductor devices and respective in-die dielectric material layers having formed therein in-die metal interconnect structures and in-die bonding pads, wherein the in-die bonding pads are bonded to a respective one of the die-side interposer bonding pads by metal-to-metal bonding; and a composite die frame laterally surrounding the at least one semiconductor die and contacting a horizontal surface of one of the interposer dielectric material layers, wherein the composite die frame comprises a molding compound die frame portion comprising a molding compound material and frame edge reinforcement structures located at corners of the composite die frame and comprising a material having a lower coefficient of thermal expansion at 20 degrees Celsius than the molding compound material.

2. The device structure of claim 1, wherein one of the frame edge reinforcement structures comprises at least one outer sidewall surface that is physically exposed to a gas-phase ambient.

3. The device structure of claim 1, wherein one of the frame edge reinforcement structures comprises at least one inner sidewall surface that is in direct contact with one of the at least one semiconductor die.

4. The device structure of claim 1, wherein one of the frame edge reinforcement structures comprises a proximal horizontal surface in direct contact with a horizontal surface of the interposer dielectric material layers.

5. The device structure of claim 1, wherein one of the frame edge reinforcement structures comprises a distal horizontal surface in direct contact with a horizontal surface of the molding compound die frame portion.

6. The device structure of claim 1, wherein one of the frame edge reinforcement structures comprises a pair of vertically-extending sidewalls in direct contact with vertical surfaces of the molding compound die frame portion.

7. The device structure of claim 1, wherein each of the at least one semiconductor die comprises a respective topmost in-die dielectric material layer that is bonded to a topmost interposer dielectric material layer selected from the interposer dielectric material layers via dielectric-to-dielectric bonding.

8. The device structure of claim 1, wherein:

the at least one semiconductor die comprises a plurality of semiconductor dies that are laterally spaced apart from one another by the molding compound die frame portion; and the frame edge reinforcement structures are located entirely outside areas of gaps between neighboring pairs of the plurality of semiconductor dies in a plan view.

9. The device structure of claim 1, wherein the frame edge reinforcement structures have a same height as each of the at least one semiconductor die.

10. The device structure of claim 1, wherein the frame edge reinforcement structures have a height that is less than a height of the at least one semiconductor die.

11. A device structure comprising:

a silicon interposer comprising a silicon substrate, through-silicon via structures provided within the silicon substrate, and interposer dielectric material layers having formed therein interposer metal interconnect structures and die-side interposer bonding pads;

at least one semiconductor die comprising in-die bonding pads that are bonded to the die-side interposer bonding pads; and

a composite die frame laterally surrounding the at least one semiconductor die and including a molding compound die frame portion comprising a molding compound material and frame edge reinforcement structures located at corners of the composite die frame and comprising a material having a lower coefficient of thermal expansion at 20 degrees Celsius than the molding compound material.

12. The device structure of claim 11, wherein the frame edge reinforcement structures comprise a material selected from an additional molding compound material, a die attachment film, an epoxy material, an underfill material, and a semiconductor material.

13. The device structure of claim 11, wherein at least one of the frame edge reinforcement structures has an L-shaped horizontal cross-sectional shape.

14. The device structure of claim 11, wherein at least one of the frame edge reinforcement structures has a rectangular horizontal cross-sectional shape.

15. The device structure of claim 11, wherein each of the at least one semiconductor die comprises a respective set of semiconductor devices and respective in-die dielectric material layers having formed therein in-die metal interconnect structures and in-die bonding pads, wherein the in-die bonding pads are bonded to a respective one of the die-side interposer bonding pads by metal-to-metal bonding.

16. A method of forming a device structure, the method comprising:

providing a structure comprising a silicon interposer including a portion of a silicon substrate, through-silicon via structures provided within the silicon substrate, and interposer dielectric material layers having formed therein interposer metal interconnect structures and die-side interposer bonding pads;

bonding at least one semiconductor die comprising in-die bonding pads to the silicon interposer such that the in-die bonding pads are bonded to the die-side interposer bonding pads; and forming a composite die frame around the at least one semiconductor die, wherein the composite die frame includes a molding compound die frame portion comprising a molding compound material and frame edge reinforcement structures located at corners of the composite die frame and comprising a material having a lower coefficient of thermal expansion at 20 degrees Celsius than the molding compound material.

17. The method of claim 16, wherein:

the structure comprise a two-dimensional array of silicon interposers including the silicon interposer; and the method comprises disposing in-process frame edge reinforcement structures around the at least one semiconductor die and dicing the in-process frame edge reinforcement structures and the silicon substrate, wherein diced portions of the in-process frame edge reinforcement structures comprise the frame edge reinforcement structures.

18. The method of claim 17, wherein the in-process frame edge reinforcement structures are disposed directly on a top surface of the interposer dielectric material layers.

19. The method of claim 17, further comprising forming a molding compound material layer comprising the molding compound material around the at least one semiconductor die and the in-process frame edge reinforcement structure, wherein the molding compound die frame portion comprises a diced portion of the molding compound material.

20. The method of claim 16, wherein:

the in-die bonding pads are bonded to the die-side inter-
poser bonding pads by metal-to-metal bonding; and each of the at least one semiconductor die comprises a
respective in-die dielectric material layer that is bonded
to the a topmost interposer dielectric layer selected
from the interposer dielectric material layers by dielec-
tric-to-dielectric bonding, forming one or more of the first gate dielectric layer and
the second gate dielectric layer to comprise at least one
of silicon oxide, aluminum oxide, hafnium oxide, haf-
nium lanthanum oxide, hafnium silicon oxide, hafnium
tantalum oxide, hafnium titanium oxide, hafnium zir-
conium oxide, zirconium oxide, titanium oxide, tanta-
lum oxide, or hafnium dioxide-alumina;

forming one or more of the first source electrode, the
second source electrode, or the shared drain electrode
to comprise one or more of TiN, W, WN, WCN, Co,
PdCo, Mo, Cu, TaN, Ti, or Al; and forming a further interlayer dielectric layer that partially
surrounds the gate electrode.

* * * * *